(12) United States Patent
Thompson et al.

(10) Patent No.: US 8,916,919 B2
(45) Date of Patent: Dec. 23, 2014

(54) INTERDIGITATED VERTICAL NATIVE CAPACITOR

(75) Inventors: Eric Thompson, Burlington, VT (US);
Roger A. Booth, Jr., Irvine, CA (US);
Ning Lu, Essex Junction, VT (US);
Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 242 days.

(21) Appl. No.: 13/167,076

(22) Filed: Jun. 23, 2011

(65) Prior Publication Data

US 2012/0326270 A1    Dec. 27, 2012

(51) Int. Cl.
| | | |
|---|---|---|
| H01L 27/108 | (2006.01) | |
| H01L 29/76 | (2006.01) | |
| H01L 23/522 | (2006.01) | |
| H01L 27/02 | (2006.01) | |
| H01L 49/02 | (2006.01) | |

(52) U.S. Cl.
CPC ........ *H01L 23/5223* (2013.01); *H01L 27/0207* (2013.01); *H01L 28/60* (2013.01)
USPC .......................................... 257/307; 257/532

(58) Field of Classification Search
CPC . H01L 23/5223; H01L 28/60; H01L 27/0805; H01L 27/0207
USPC ............................ 257/307, 528, 532, E29.342
See application file for complete search history.

(56) References Cited

U.S. PATENT DOCUMENTS

| | | | |
|---|---|---|---|
| 5,583,359 A | | 12/1996 | Ng et al. |
| 6,819,542 B2 * | | 11/2004 | Tsai et al. ..................... 361/304 |
| 6,980,414 B1 | | 12/2005 | Sutardja |
| 7,050,290 B2 | | 5/2006 | Tang et al. |
| 7,166,902 B1 | | 1/2007 | Badrieh et al. |
| 7,551,421 B2 | | 6/2009 | Thompson et al. |
| 7,557,427 B2 * | | 7/2009 | Okuda et al. .................. 257/532 |
| 7,701,037 B2 | | 4/2010 | Chinthakindi et al. |
| 7,859,039 B2 * | | 12/2010 | Yeh .............................. 257/306 |
| 2004/0174655 A1 | | 9/2004 | Tsai et al. |
| 2007/0181918 A1 | | 8/2007 | Wada et al. |

(Continued)

OTHER PUBLICATIONS

International Search Report dated Dec. 26, 2012 issued in International Application No. PCT/US2012/040849.
Application No. GB1322254.2 Examination Report.
United Kingdom Examination Report dated Jul. 24, 2014 received in a corresponding foreign application.

*Primary Examiner* — Hung Vu
(74) *Attorney, Agent, or Firm* — Scully, Scott, Murphy & Presser, P.C.; Catherine Ivers, Esq.

(57) ABSTRACT

A metal capacitor structure includes a plurality of line level structures vertically interconnected with via level structures. Each first line level structure and each second line level structure includes a set of parallel metal lines that is physically joined at an end to a rectangular tab structure having a rectangular horizontal cross-sectional area. A first set of parallel metal lines within a first line level structure and a second set of parallel metal lines within a second line level structure are interdigitated and parallel to each other, and can collectively form an interdigitated uniform pitch structure. Because the rectangular tab structures do not protrude toward each other within a region between two facing sidewalls of the rectangular tab structures, sub-resolution assist features (SRAFs) can be employed to provide a uniform width and a uniform pitch throughout the entirety of the interdigitated uniform pitch structure.

24 Claims, 15 Drawing Sheets

(56) References Cited

U.S. PATENT DOCUMENTS

| | | |
|---|---|---|
| 2007/0228520 A1 | 10/2007 | Winn et al. |
| 2007/0296059 A1 | 12/2007 | Okuda |
| 2008/0054401 A1 | 3/2008 | Park |
| 2010/0127347 A1 | 5/2010 | Quinn |
| 2010/0237468 A1 | 9/2010 | Daley et al. |
| 2010/0295153 A1* | 11/2010 | Chu et al. .................. 257/532 |
| 2010/0309605 A1 | 12/2010 | Lin |

* cited by examiner

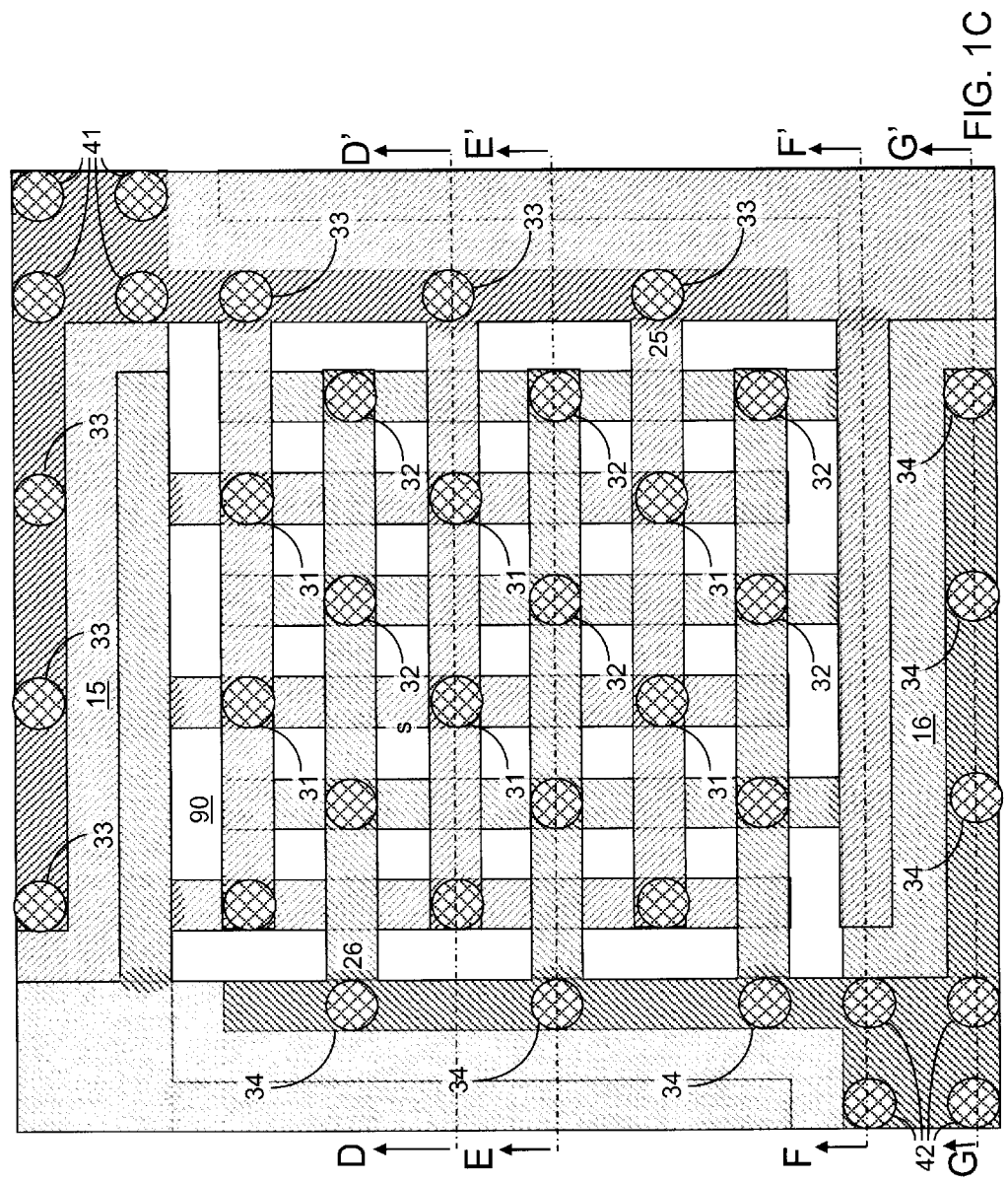

INTERDIGITATED VERTICAL NATIVE CAPACITOR

BACKGROUND

The present disclosure relates to capacitor structures, and particularly to capacitor structures having interdigitated conductive lines, and methods of manufacturing the same.

Back-end-of-line (BEOL) metal capacitors are important devices for foundry and server applications. BEOL metal capacitors have electrical properties that are beneficial to analog circuits. For example, BEOL metal capacitors provide good mismatch tolerance, low parasitic capacitance, and low voltage and temperature coefficients of capacitance.

BEOL metal capacitors employ conductive lines embedded in a dielectric material layer. The conductive lines are formed as metal lines filling line trenches in the dielectric material layer at the same time when other metal lines for metal interconnect structures are formed. The distance between the conductive lines is typically a critical dimension, i.e., the smallest dimension that may be printed by lithographic methods. Because such BEOL metal capacitors are formed in the same processing steps that are employed to form other metal interconnect structures, such BEOL metal capacitors may be manufactured without incurring an additional processing cost.

As semiconductor devices scale and the pitch of metal lines shrink, new patterning constraints are introduced. These constraints can often make scaling old designs into new technologies impossible. Therefore, new and flexible designs for BEOL metal capacitors are desired.

BRIEF SUMMARY

A metal capacitor structure includes a plurality of line level structures vertically interconnected with via level structures. Within each line level, a first line level structure and a second line level structure are provided. Each first line level structure and each second line level structure includes a set of parallel metal lines that is physically joined at an end to a rectangular tab structure having a rectangular horizontal cross-sectional area. A first set of parallel metal lines of the first line level structure and a second set of parallel metal lines of the second line level structure are interdigitated and parallel to one another. The first set of parallel metal lines and the second set of parallel metal lines can collectively form an interdigitated uniform pitch structure so that the pitch between each adjacent pair of parallel metal lines is the same within the interdigitated uniform pitch structure.

Rectangular tab structures for each pair of vertically adjacent line levels are interconnected by a set of inter-tab vias underlying or overlying a corner region of each rectangular tab structure. Within the corner region, the horizontal cross-sectional areas of the two rectangular tab structures overlap. Because the rectangular tab structures do not protrude toward each other within a region between two facing sidewalls of the rectangular tab structures within each line level, sub-resolution assist features (SRAFs) can be employed to provide a uniform width and a uniform pitch throughout the entirety of the interdigitated uniform pitch structure without conflicting with lithographic features for the rectangular tab structures. The uniform width and the uniform pitch within the interdigitated uniform pitch structure thus render the metal capacitor structure easy to manufacture with tight process control and enhanced repeatability. Optionally, line-tab metal vias can provide electrical contact between some of the parallel metal lines and overlying and/or underlying rectangular tab structures in a vertically adjacent line level that belongs to the same electrode of the metal capacitor structure as the parallel metal lines.

According to an aspect of the present disclosure, a metal capacitor structure is provided, which includes a plurality of line level structures and at least one via level structure. Each line level structure among the plurality of line level structures includes: a first line level structure including a first rectangular tab structure having a shape of a first rectangular parallelepiped and a first plurality of parallel metal lines protruding from, and adjoined to, a sidewall of the first rectangular tab structure; and a second line level structure including a second rectangular tab structure having a shape of a second rectangular parallelepiped and a second plurality of parallel metal lines protruding from, and adjoined to, a sidewall of the second rectangular tab structure. The first plurality of parallel metal lines and the second plurality of parallel metal lines collectively constitute an interdigitated uniform pitch structure having a pitch in a direction, and the first rectangular tab structure and the second rectangular tab structure do not protrude into a region between the sidewall of the first rectangular tab structure and the sidewall of the second rectangular tab structure.

BRIEF DESCRIPTION OF THE SEVERAL VIEWS OF THE DRAWINGS

FIGS. 1A-1G are various views of a first exemplary structure that includes a metal capacitor structure according to a first embodiment of the present disclosure. FIG. 1A is a horizontal cross-sectional view along a horizontal plane A-A' in FIGS. 1D-1G; FIG. 1B is a horizontal cross-sectional view along a horizontal plane B-B' in FIGS. 1D-1G; FIG. 1C is a horizontal cross-sectional view along a horizontal plane C-C' in FIGS. 1D-1G; FIG. 1D is a vertical cross-sectional view along a vertical plane D-D' in FIGS. 1A-1C; FIG. 1E is a vertical cross-sectional view along a vertical plane E-E' in FIGS. 1A-1C; FIG. 1F is a vertical cross-sectional view along a vertical plane F-F' in FIGS. 1A-1C; and FIG. 1G is a vertical cross-sectional view along a vertical plane G-G' in FIGS. 1A-1C.

FIG. 2A is a horizontal cross-sectional view along a horizontal plane A-A' in FIGS. 2D-2G; FIG. 2B is a horizontal cross-sectional view along a horizontal plane B-B' in FIGS. 2D-2G; FIG. 2C is a horizontal cross-sectional view along a horizontal plane C-C' in FIGS. 2D-2G; FIG. 2D is a vertical cross-sectional view along a vertical plane D-D' in FIGS. 2A-2C; FIG. 2E is a vertical cross-sectional view along a vertical plane E-E' in FIGS. 2A-2C; and FIG. 2F is a vertical cross-sectional view along a vertical plane F-F' in FIGS. 2A-2C.

DETAILED DESCRIPTION

Figure 1A:
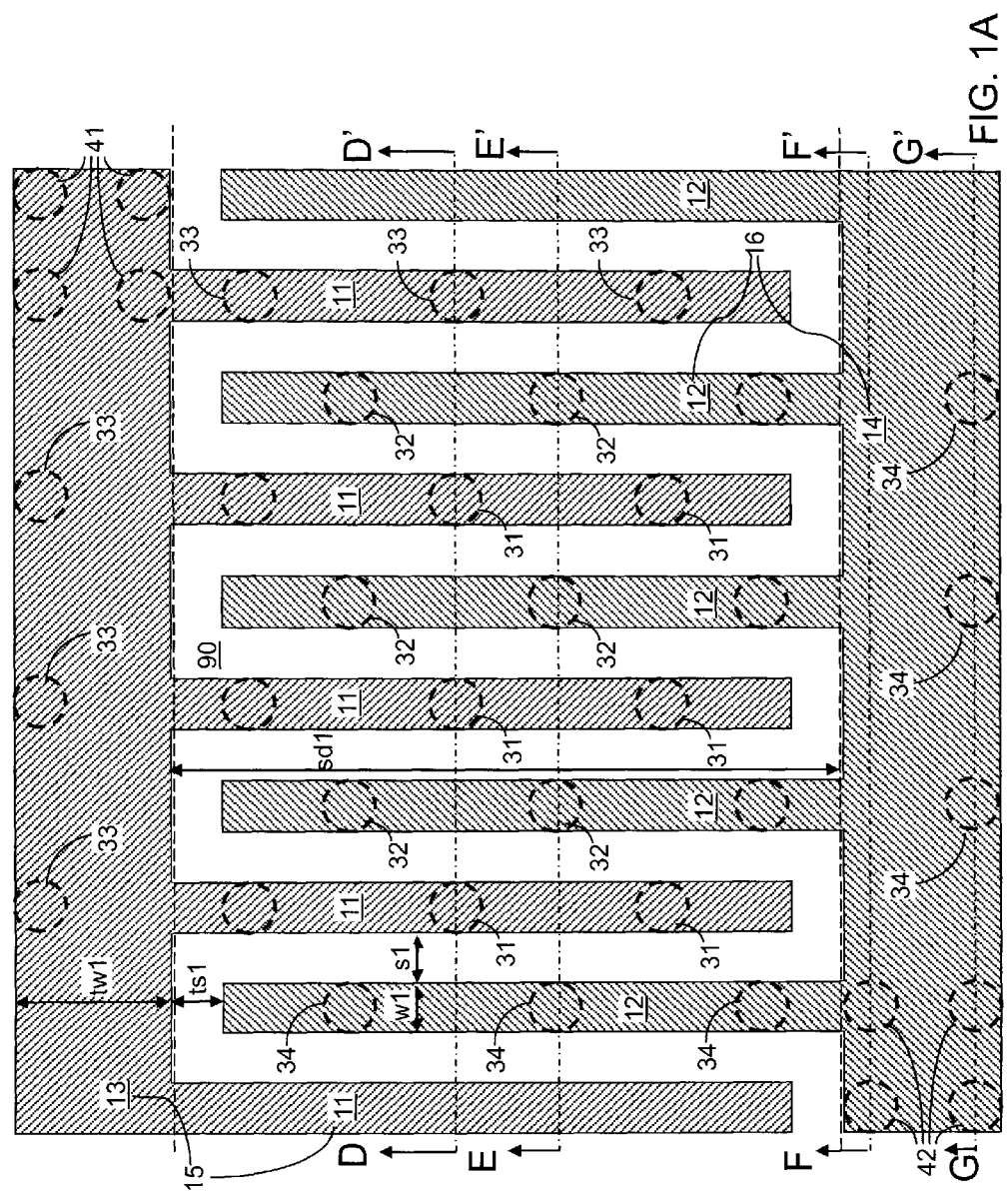

As stated above, the present disclosure relates to capacitor structures having interdigitated conductive lines, and methods of manufacturing the same, which are described herein with accompanying figures. Throughout the drawings, the same reference numerals or letters are used to designate like or equivalent elements. Detailed descriptions of known functions and constructions unnecessarily obscuring the subject matter of the present disclosure have been omitted for clarity. The drawings are not necessarily drawn to scale.

Referring to FIGS. 1A-1G, a first exemplary structure that includes a metal capacitor structure according to a first embodiment of the present disclosure is illustrated in various views. The metal capacitor structure in FIGS. 1A-1G can be formed on a substrate (not shown), which can be a semiconductor substrate on which semiconductor devices can be formed. The metal capacitor structure can be formed in a plurality of metal interconnect levels, which includes at least two line levels and at least one via level. Specifically, the metal capacitor structure can be embedded in at least one dielectric material layer 90, which includes a dielectric material such as silicon oxide, silicon nitride, organosilicate glass, or a combination thereof.

As used herein, a "line level" refers to an interconnect level in which conductive interconnect structures configured to provide electrical connections in horizontal directions, i.e., in directions that are parallel to topmost surfaces of the conductive interconnect structures therein, are present. Further, a "via level" refers to an interconnect level in which conductive interconnect structures configured to provide electrical connections in a vertical direction, i.e., in a direction that is perpendicular to topmost surfaces of the conductive interconnect structures therein, are present.

In general, the metal capacitor structure can be located over n vertically adjacent line levels and (n−1) vertically adjacent via levels located between the topmost line level and the bottommost line level among the n vertically adjacent line levels. The number n is an integer greater than 1, i.e., 2, 3, 4, etc. The metal capacitor structure can be located over any set of n vertically adjacent line levels. For example, the metal capacitor structure can be located from x-th line level (which is typically referred to as an "Mx level") to (x+n−1)-th line level (which is typically referred to as an "M(x+n−1) level"), in which x is any positive integer provided that x+n−1 does not exceed the total number of line levels in a structure embedding the metal capacitor structure.

Within each line level, the metal capacitor structure includes a set of two integrally formed structures that do not contact each other. The first of the two integrally formed structures is herein referred to as a "first line level structure," and the second of the two integrally formed structures is herein referred to as a "second line level structure." Thus, the metal capacitor structure can include 2 n number of integrally formed structures located over n line levels.

Figure 1B:
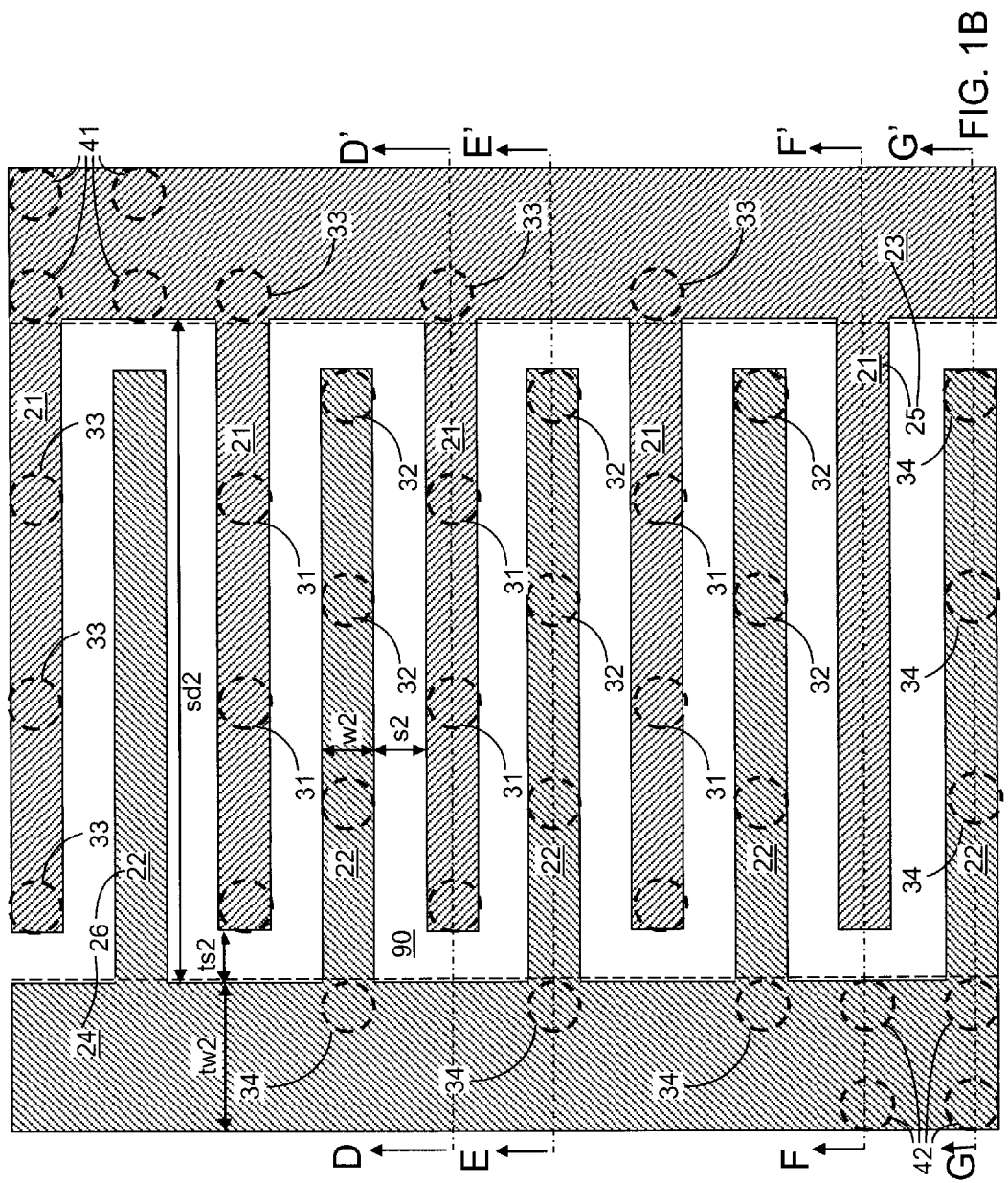
Figure 1D:
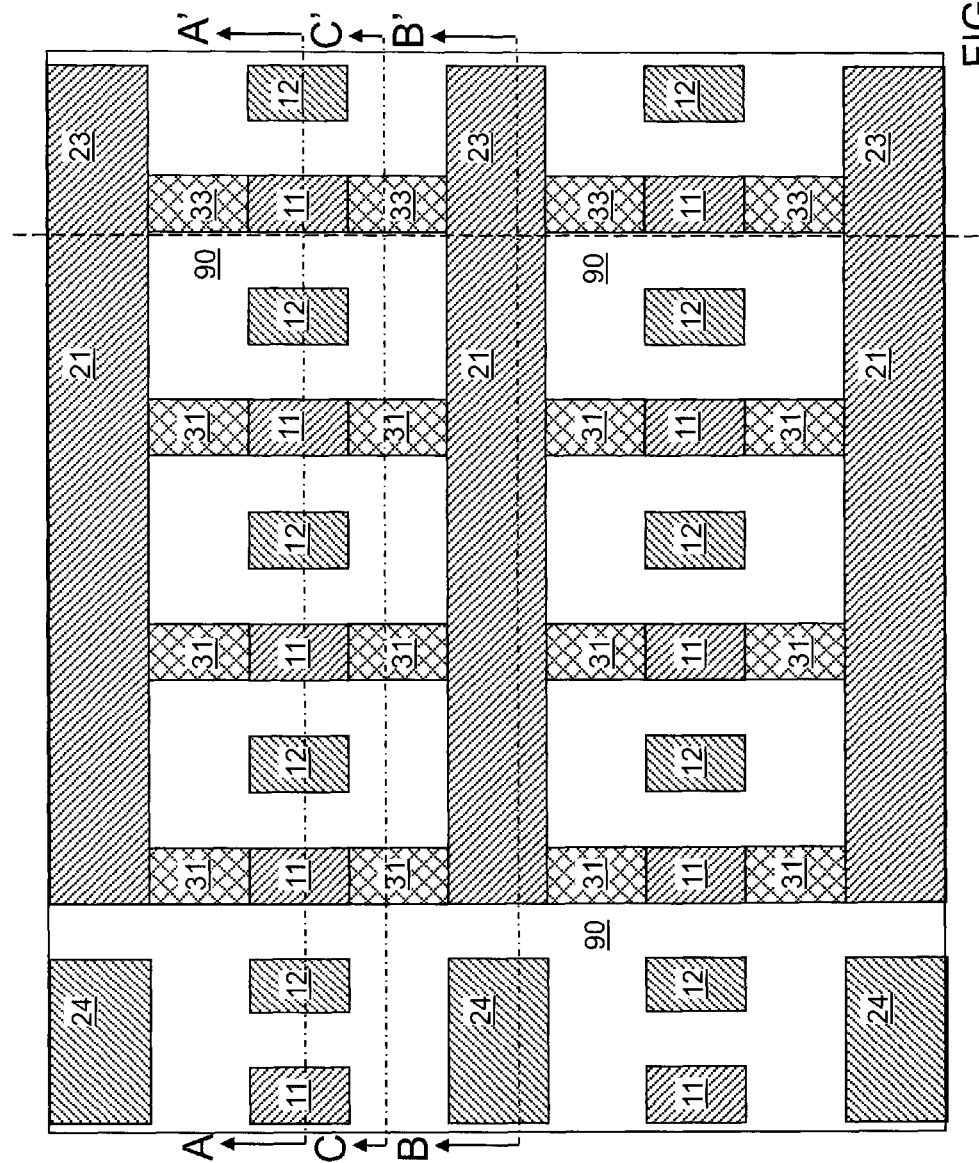
Figure 1E:
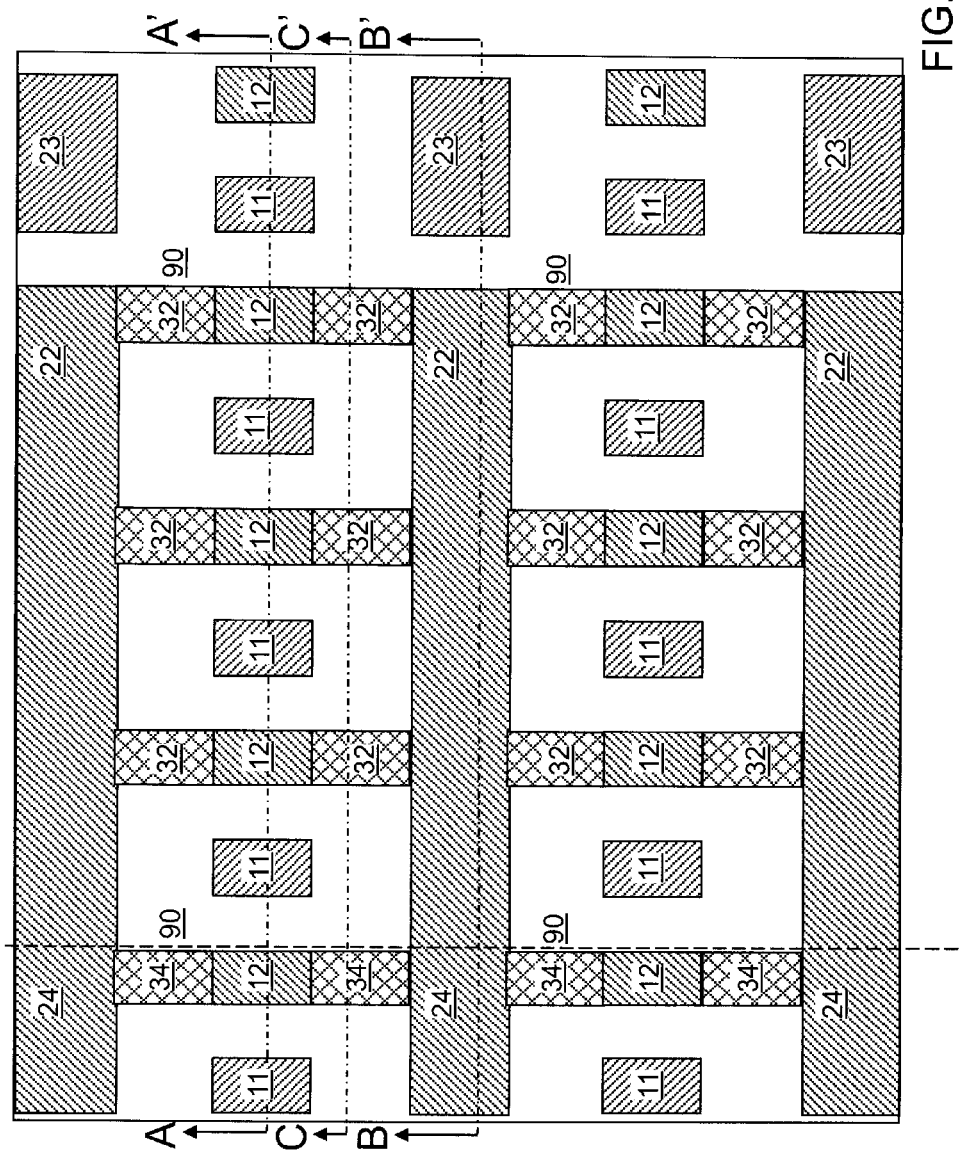
Figure 1F:
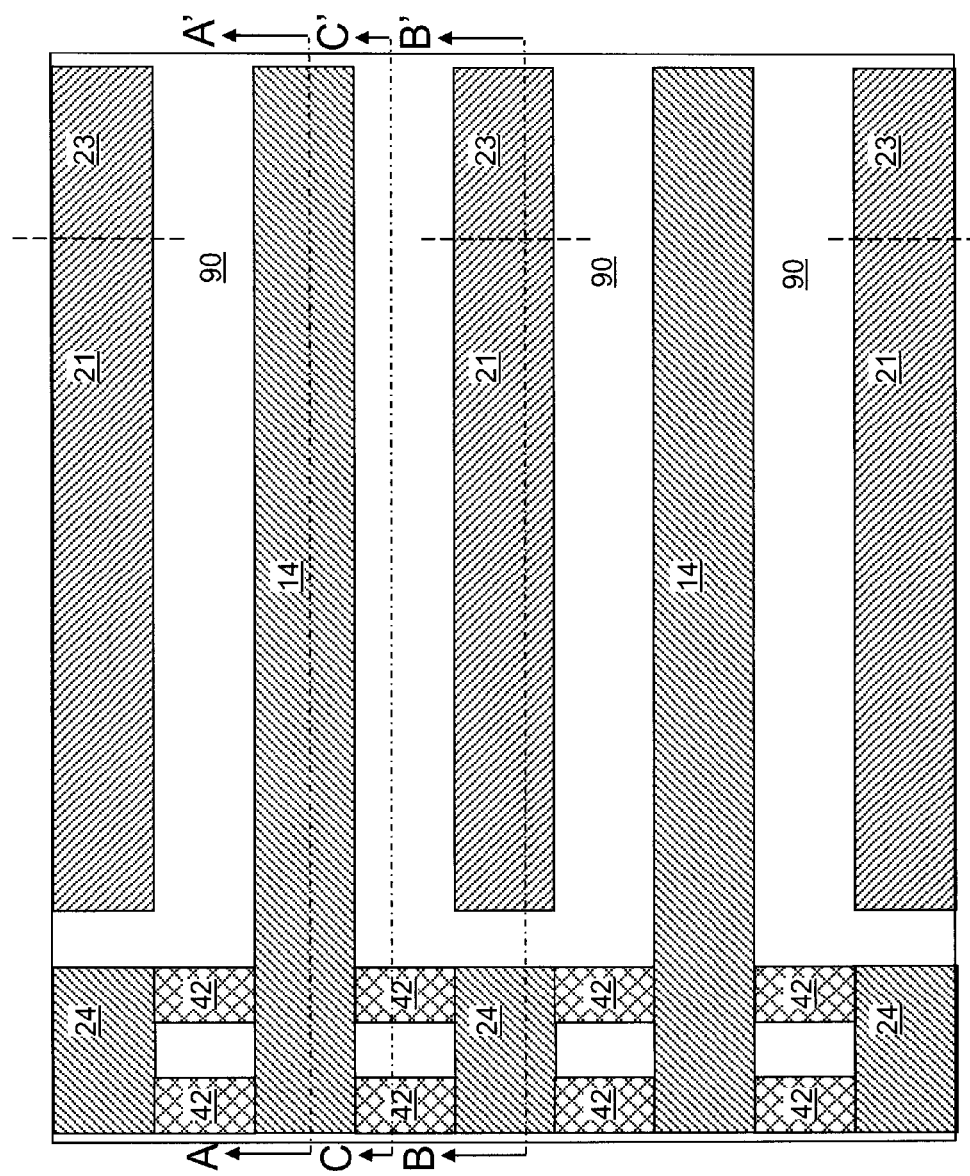
Figure 1G:
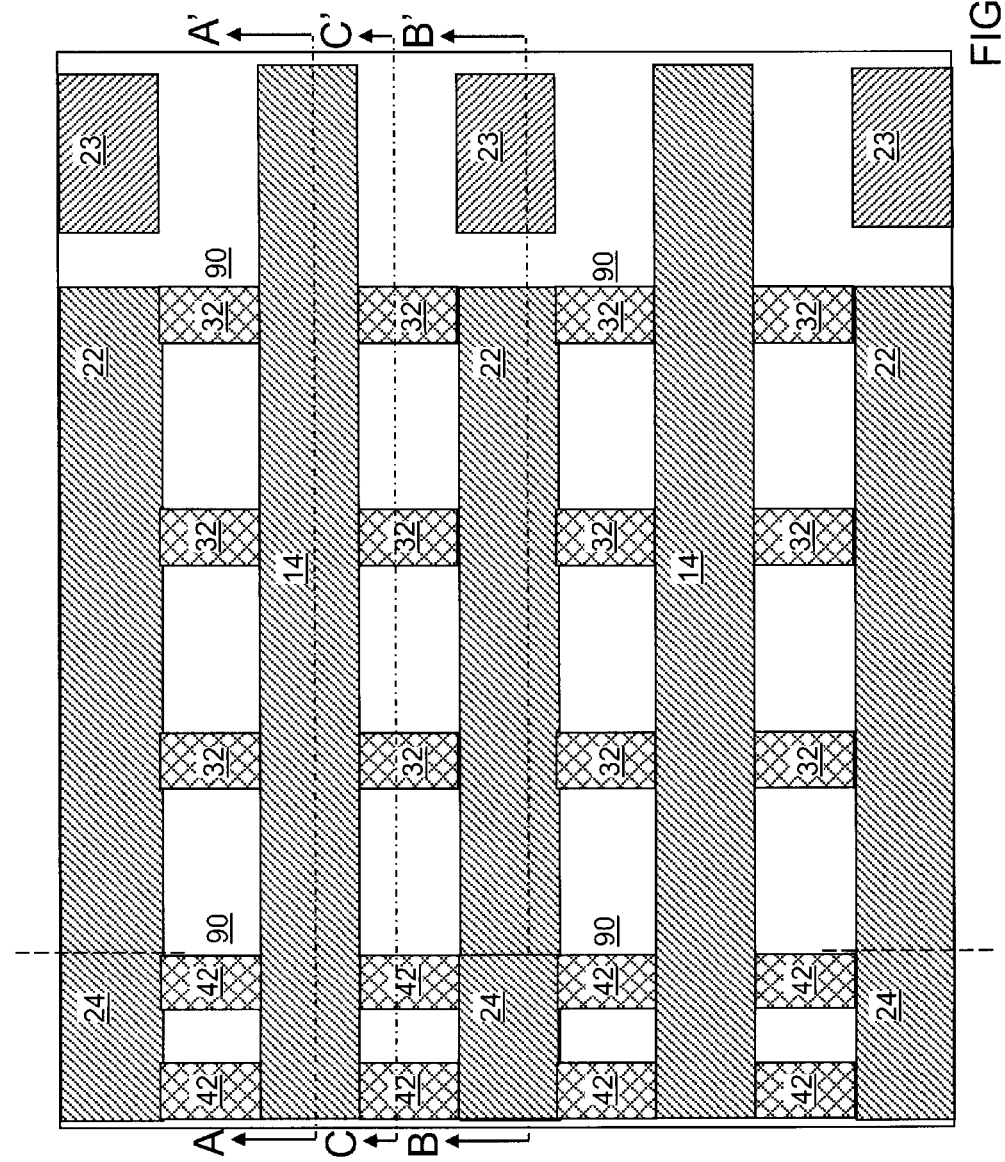
Figure 2A:
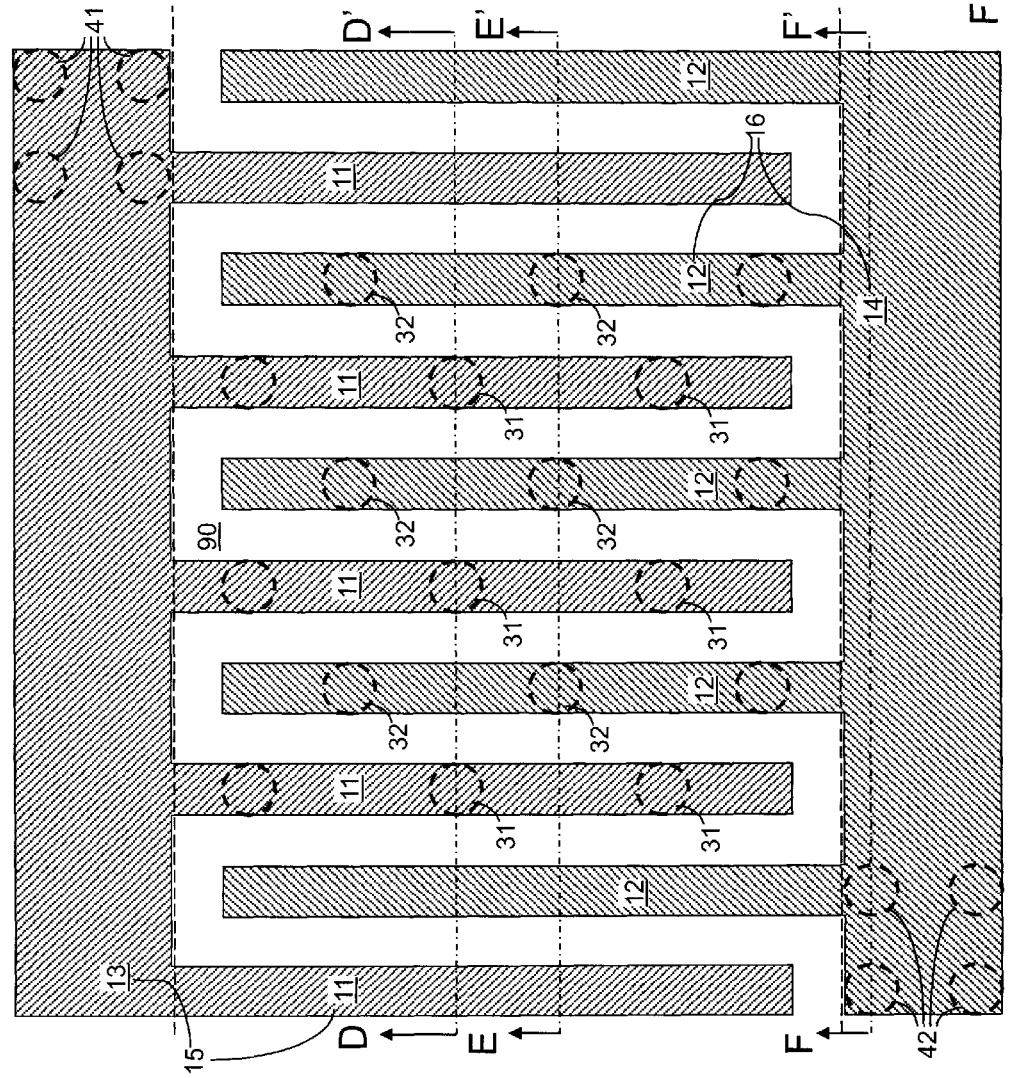
FIGS. 2A-2F are various views of a second exemplary structure that includes a metal capacitor structure according to a second embodiment of the present disclosure.
Figure 2B:
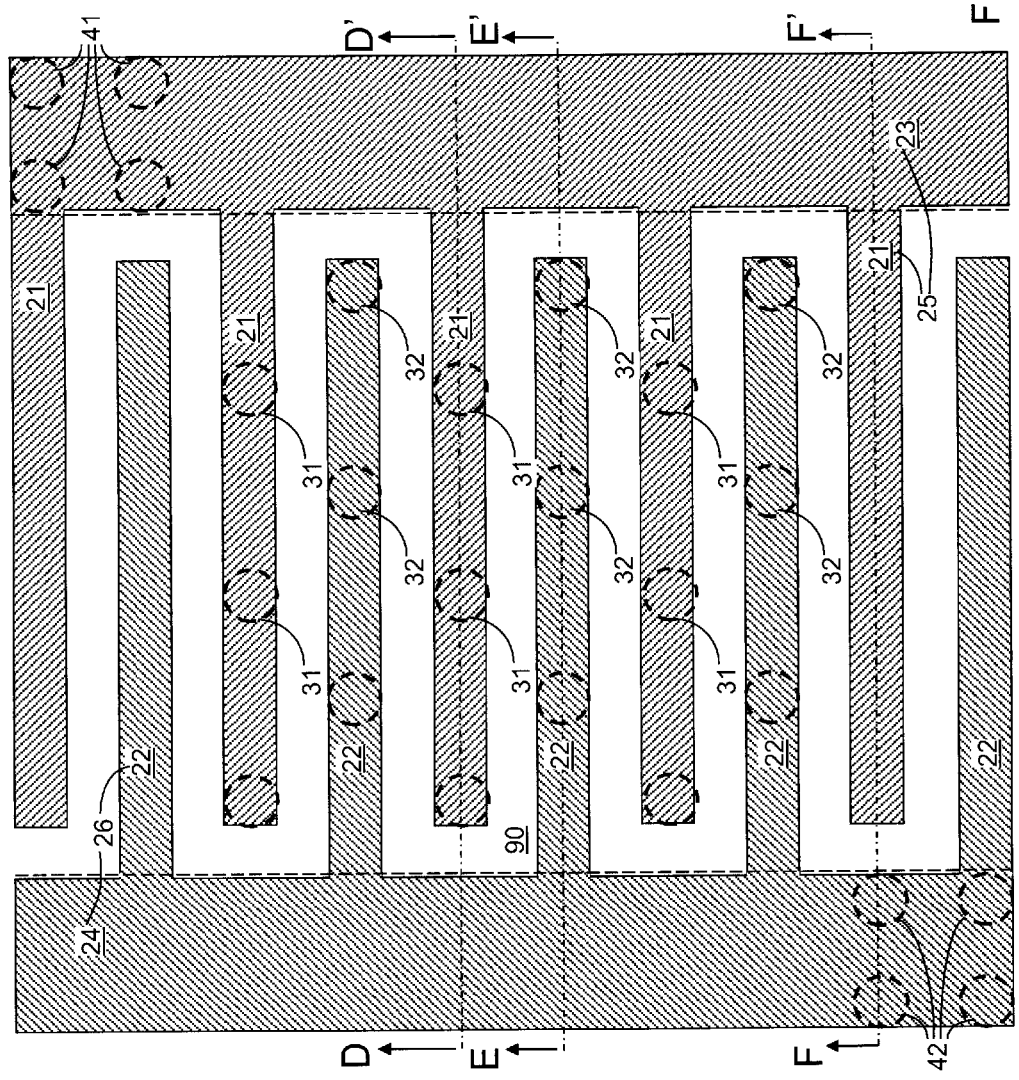
Figure 2C:
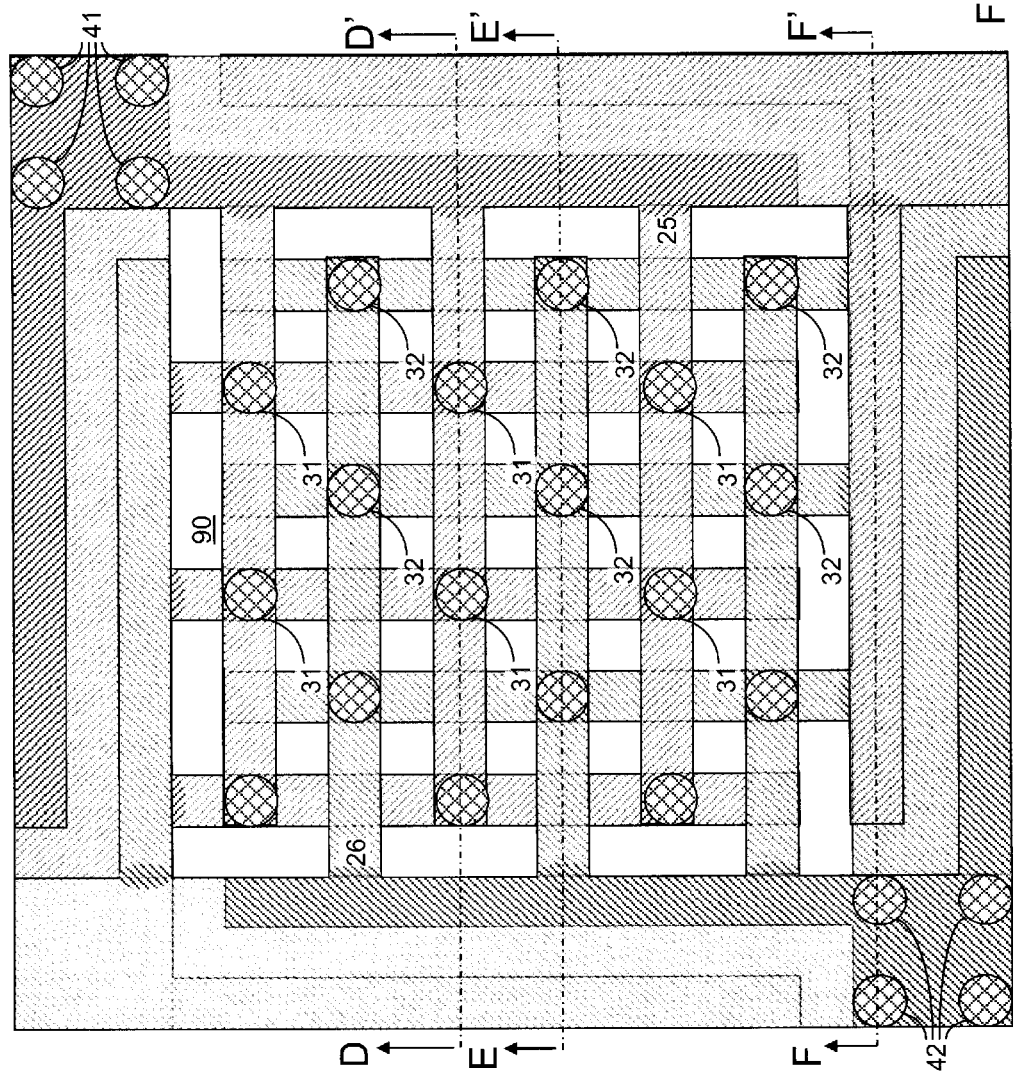
Figure 2D:
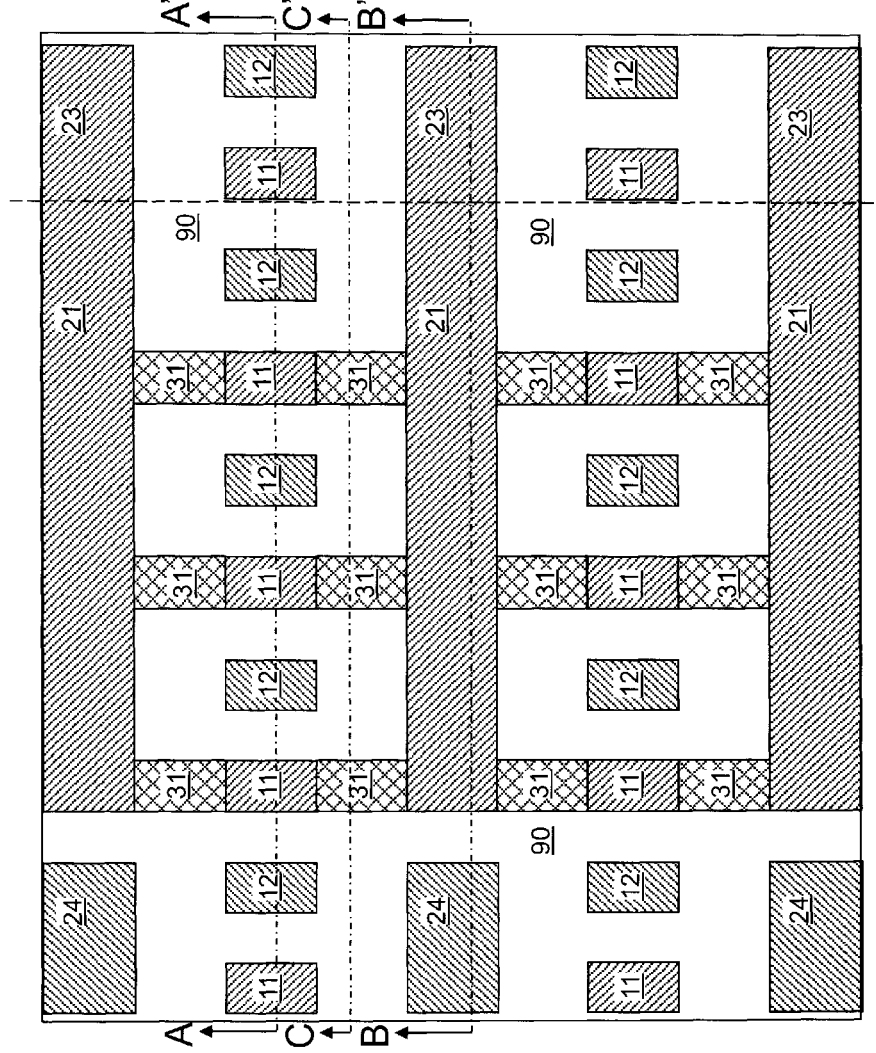
Figure 2E:
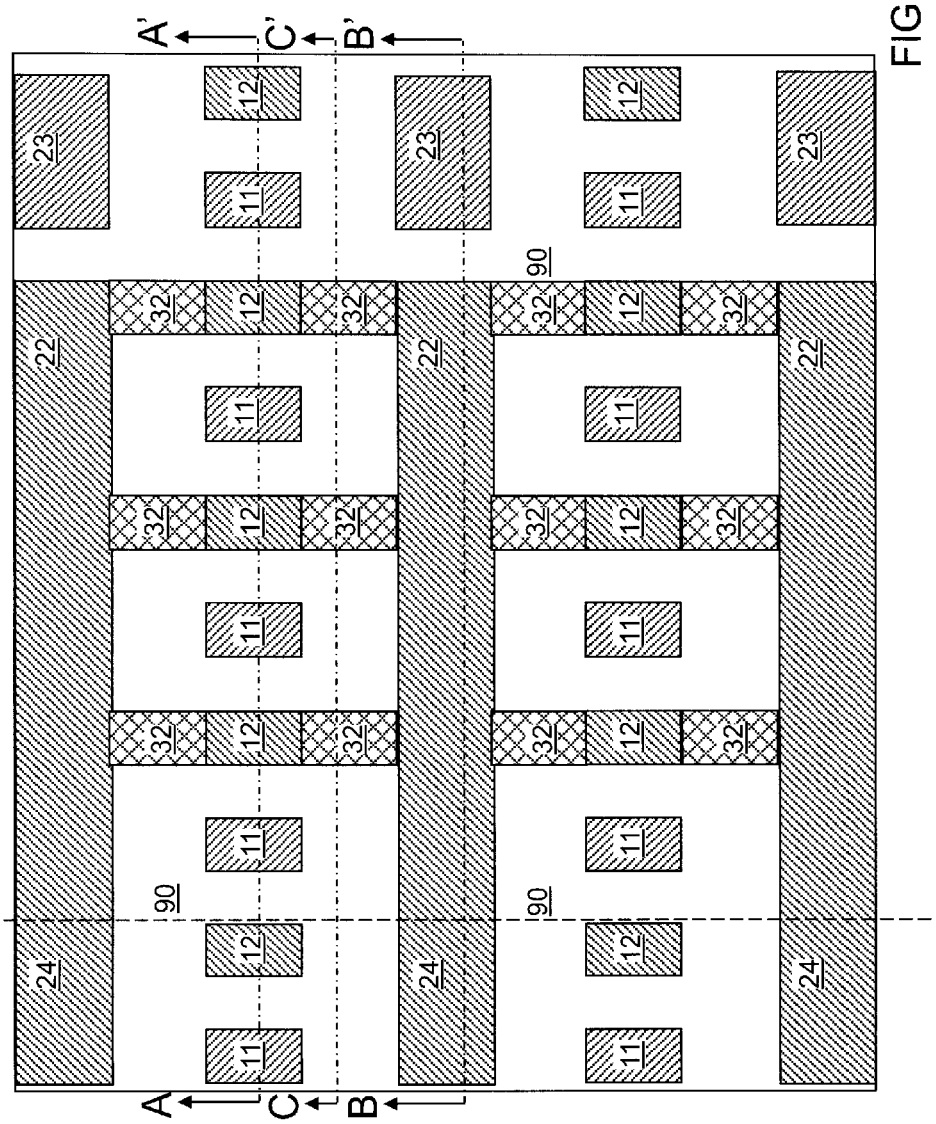
Figure 2F:
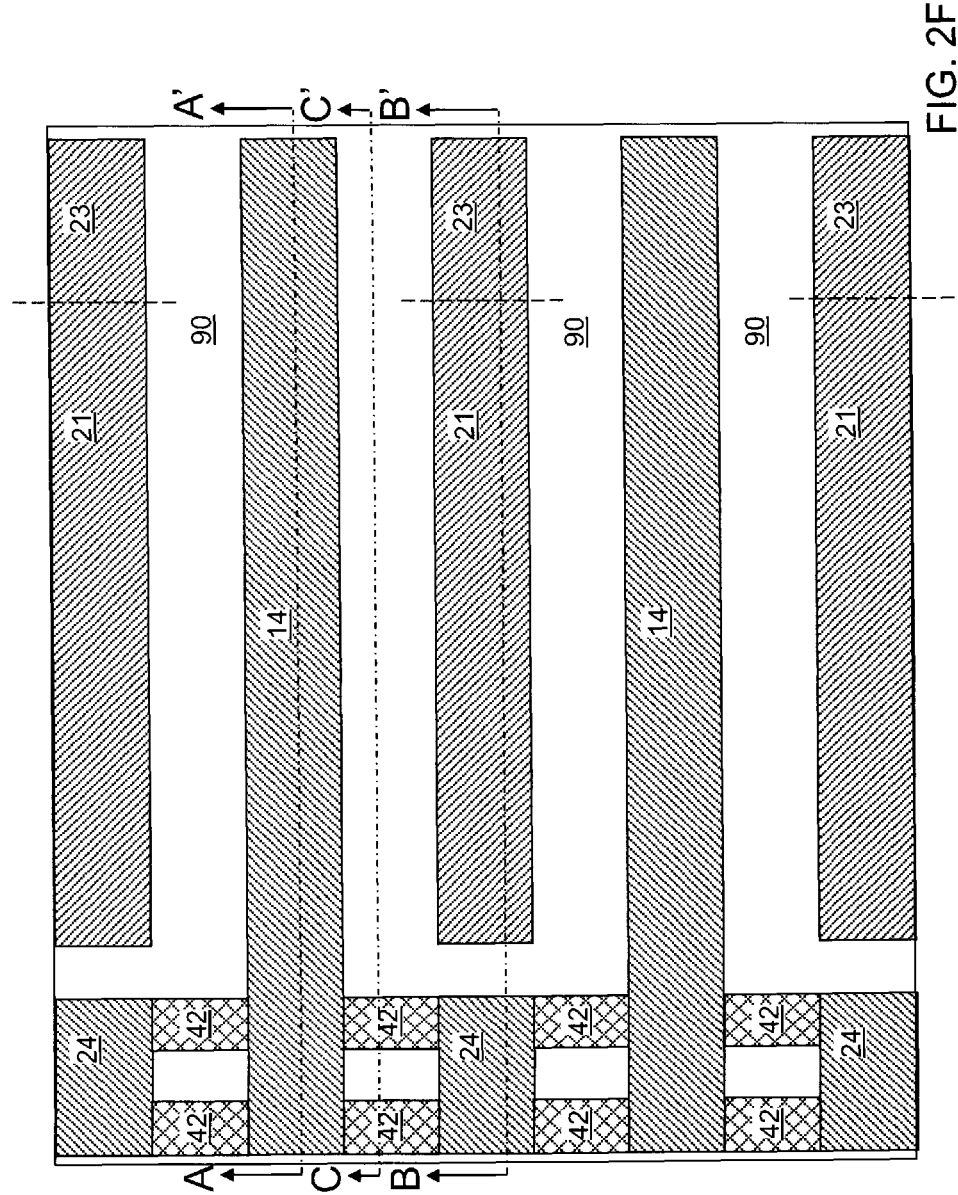

A first line level structure 15 and a second line level structure 16 corresponding to the line level at the plane A-A' in FIGS. 1D-1G are illustrated in FIG. 1A. Likewise, a first line level structure 25 and a second line level structure 26 corresponding to the line level at the plane B-B' in FIGS. 1D-1G are illustrated in FIG. 1B.

In FIG. 1A, the first line level structure 15 includes a first rectangular tab structure 13 and a first plurality of parallel metal lines 11. The first rectangular tab structure 13 has a horizontal cross-sectional area of a rectangle. Because the first rectangular tab structure 13 is formed within the line level of the A-A' plane as a three-dimensional structure, the first rectangular tab structure 13 has a shape of a first rectangular parallelepiped. Likewise, the second rectangular tab structure 14 has a horizontal cross-sectional area of another rectangle. Because the second rectangular tab structure 14 is also formed within the line level of the A-A' plane as a three-dimensional structure, the second rectangular tab structure 14 has a shape of a second rectangular parallelepiped. It is understood that sidewalls of the first rectangular tab structure 13 and the second rectangular tab structure 14 may not be completely vertical due to process limitations, such as limitations of an etch process employed to pattern trenches in the at least one dielectric material layer before depositing a metallic material that subsequently form the first line level structure 15 and the second line level structure 16. Thus, the shape of a rectangular parallelepiped as used herein includes shapes that deviate from an ideal rectangular parallelepiped shape due to process limitations.

The first line level structure 15 further includes a first plurality of parallel metal lines 11. The first plurality of parallel metal lines 11 protrudes from, and is adjoined to, a sidewall of the first rectangular tab structure 13. Likewise, the second line level structure 16 further includes a second plurality of parallel metal lines 12. The second plurality of parallel metal lines 12 protrudes from, and is adjoined to, a sidewall of the second rectangular tab structure 14.

Each metal line within the first plurality of parallel metal lines 11 and the second plurality of parallel metal lines 12 can have a same width, which is herein referred to as a first width w1, that remains invariant under translation in a horizontal direction parallel to the lengthwise direction of the first plurality of parallel metal lines 11 and the second plurality of parallel metal lines 12, i.e., a horizontal direction perpendicular to the D-D' plane. Further, the spacing between each adjacent pair of metal lines, i.e., between any of the first plurality of parallel metal lines 11 and the most proximate of the second plurality of parallel metal lines 12, can be the same, which is herein referred to as a first spacing s1. The first spacing s1 can remain invariant under translation in a horizontal direction perpendicular to the lengthwise direction of the first plurality of parallel metal lines 11 and the second plurality of parallel metal lines 12.

The first plurality of parallel metal lines 11 and the second plurality of parallel metal lines 12 collectively constitute an interdigitated uniform pitch structure (11, 12) having a pitch in a direction, which is an horizontal direction parallel to the plane D-D' in FIG. 1A. The pitch is the sum of the first width w1 and the first spacing s1. The interdigitated uniform pitch structure (11, 12) is "interdigitated" by alternately placing one of the first plurality of parallel metal lines 11 and one of the second plurality of parallel metal lines 12 along a horizontal direction, which is the horizontal direction parallel to the D-D' plane. Further, the interdigitated uniform pitch structure (11, 12) has a "uniform pitch," i.e., a pitch that is invariant under translation in a horizontal direction parallel to the lengthwise direction of the first plurality of parallel metal lines 11 and the second plurality of parallel metal lines 12, i.e., invariant under translation in the horizontal direction perpendicular to the D-D' plane.

The first rectangular tab structure 13 and the second rectangular tab structure 14 are laterally spaced by a same distance throughout, which is herein referred to as a first separation distance sd1. The first separation distance sd1 is invariant under translation along the horizontal direction of the sidewall of the first rectangular tab structure 13, which is perpendicular to the lengthwise direction of the metal lines in the interdigitated uniform pitch structure (11, 12). This lengthwise direction is a horizontal direction perpendicular to the D-D' plane. Further, the first separation distance sd1 is invariant under translation along the horizontal direction of the sidewall of the second rectangular tab structure 14, which is also perpendicular to the lengthwise direction of the metal lines in the interdigitated uniform pitch structure (11, 12).

The first separation distance sd1 is greater than any length of the first plurality of parallel metal lines 11 and the second plurality of parallel metal lines 12. If the first plurality of parallel metal lines 11 has the same length and/or the second plurality of parallel metal lines 12 has the same length, the first separation distance sd1 can be the sum of the length of the first or second plurality of parallel metal lines (11 or 12) and a first tab spacing ts1. Because each of the first rectangular tab structure 13 and the second rectangular tab structure 14 has a rectangular horizontal cross-sectional area, the first rectangular tab structure 13 and the second rectangular tab structure 14 do not protrude into a region between a proximal sidewall of the first rectangular tab structure 13 and a proximal sidewall of the second rectangular tab structure 14. The proximal sidewall of the first rectangular tab structure 13 is the sidewall of the first rectangular tab structure 13 that is most proximal to the second rectangular tab structure 14, and is located in a vertical plane that intersects boundaries between the first rectangular tab structure 13 and the first plurality of parallel metal lines 11 (which is represented by a dotted line in FIG. 1A). The proximal sidewall of the second rectangular tab structure 14 is the sidewall of the second rectangular tab structure 14 that is most proximal to the first rectangular tab structure 13, and is located in a vertical plane that intersects boundaries between the second rectangular tab structure 14 and the second plurality of parallel metal lines 12 (which is represented by another dotted line in FIG. 1A).

The n vertically adjacent line levels can be divided into odd-numbered line levels and even-numbered line levels. The pair of a first line level structure and a second line level structure in an even-numbered line level can be aligned to another pair of a first line level structure and a second line level structure in an even-numbered line level such that the lengthwise directions of an interdigitated uniform pitch structure in the even-numbered line level is perpendicular to the lengthwise direction of an interdigitated uniform pitch structure in the odd-numbered line level. For purposes of illustration, the line level at the A-A' plane is herein considered to be an even-numbered line level (such as M2, M4, M6, etc.), and the line level at the B-B' plane is herein considered to be an odd-numbered line level (such as M1, M3, M5, etc.). The overlap between the structures in the even-numbered line level and the structures in the odd-numbered line level is illustrated in FIG. 1C, which juxtaposes the shapes of structures in an overlying level (the line level in the A-A' plane) with hatching in one direction upon the shapes of structures in an underlying level (the line level in the B-B' plane) with hatching in the other direction. Via level structures in the C-C' plane are also shown in FIG. 1C.

Since each line level structure has the same features as the first line level structure 15 or the second line level structure 16 illustrated in FIG. 1A, a first line level structure 25 and a second line level structure 26 in FIG. 1B have the same features as the first line level structure 15 or the second line level structure 16 of FIG. 1A with possible modifications in dimensions.

Therefore, the first line level structure 25 includes a first rectangular tab structure 23 and a first plurality of parallel metal lines 21. The first rectangular tab structure 23 has a horizontal cross-sectional area of a rectangle. The first rectangular tab structure 23 has a shape of a first rectangular parallelepiped. The second rectangular tab structure 24 has a horizontal cross-sectional area of another rectangle. The second rectangular tab structure 24 has a shape of a second rectangular parallelepiped.

The first line level structure 25 further includes a first plurality of parallel metal lines 21. The first plurality of parallel metal lines 21 protrudes from, and is adjoined to, a sidewall of the first rectangular tab structure 23. Likewise, the second line level structure 26 further includes a second plurality of parallel metal lines 22. The second plurality of parallel metal lines 22 protrudes from, and is adjoined to, a sidewall of the second rectangular tab structure 24.

Each metal line within the first plurality of parallel metal lines 21 and the second plurality of parallel metal lines 22 can have a same width, which is herein referred to as a second width w2, that remains invariant under translation in a horizontal direction parallel to the lengthwise direction of the first plurality of parallel metal lines 21 and the second plurality of parallel metal lines 22, i.e., a horizontal direction parallel to the D-D' plane. The second width w2 can be the same as, or different from, the first width w1 depending the design of the metal capacitor structure. Further, the spacing between each adjacent pair of metal lines, i.e., between any of the first plurality of parallel metal lines 21 and the most proximate of the second plurality of parallel metal lines 22, can be the same, which is herein referred to as a second spacing s2. The second spacing s2 can remain invariant under translation in a horizontal direction perpendicular to the lengthwise direction of the first plurality of parallel metal lines 21 and the second plurality of parallel metal lines 22. The second spacing s2 can be the same as, or different from, the first spacing s1 depending on the design of the metal capacitor structure.

The first plurality of parallel metal lines 21 and the second plurality of parallel metal lines 22 collectively constitute another interdigitated uniform pitch structure (21, 22) having a pitch in a direction, which is an horizontal direction perpendicular to the plane D-D' in FIG. 1B. The pitch is the sum of the second width w2 and the second spacing s2. The pitch of this interdigitated uniform pitch structure (21, 22) can be the same as, or different from, the pitch of the interdigitated uniform pitch structure (11, 12) located at the level of the A-A' plane. The interdigitated uniform pitch structure (21, 22) is "interdigitated" by alternately placing one of the first plurality of parallel metal lines 21 and one of the second plurality of parallel metal lines 22 along a horizontal direction, which is the horizontal direction perpendicular to the D-D' plane. Further, the interdigitated uniform pitch structure (21, 22) has a "uniform pitch," i.e., a pitch that is invariant under translation in a horizontal direction parallel to the lengthwise direction of the first plurality of parallel metal lines 21 and the second plurality of parallel metal lines 22, i.e., invariant under translation in the horizontal direction parallel to the D-D' plane.

The first rectangular tab structure 23 and the second rectangular tab structure 24 are laterally spaced by a same distance throughout, which is herein referred to as a second separation distance sd2. The second separation distance sd2 is invariant under translation along the horizontal direction of the sidewall of the first rectangular tab structure 23, which is perpendicular to the lengthwise direction of the metal lines in the interdigitated uniform pitch structure (21, 22). This lengthwise direction is a horizontal direction within the D-D' plane. Further, the second separation distance sd2 is invariant under translation along the horizontal direction of the sidewall of the second rectangular tab structure 24, which is also perpendicular to the lengthwise direction of the metal lines in the interdigitated uniform pitch structure (21, 22).

The second separation distance sd2 can be the same as, or different from, the first separation distance sd1 depending on the design of the metal capacitor structure. The second separation distance sd2 is greater than any length of the first plurality of parallel metal lines 21 and the second plurality of parallel metal lines 22. If the first plurality of parallel metal lines 21 has the same length and/or the second plurality of parallel metal lines 22 has the same length, the second separation distance sd2 can be the sum of the length of the first or second plurality of parallel metal lines (11 or 22) and a second tab spacing ts2. Because each of the first rectangular tab structure 23 and the second rectangular tab structure 24 has a rectangular horizontal cross-sectional area, the first rectangular tab structure 23 and the second rectangular tab structure 24 do not protrude into a region between a proximal sidewall of the first rectangular tab structure 23 and a proximal sidewall of the second rectangular tab structure 24. The proximal sidewall of the first rectangular tab structure 23 is the sidewall of the first rectangular tab structure 23 that is most proximal to the second rectangular tab structure 24, and is located in a vertical plane that intersects boundaries between the first rectangular tab structure 23 and the first plurality of parallel metal lines 21 (which is represented by a dotted line in FIG. 1B). The proximal sidewall of the second rectangular tab structure 24 is the sidewall of the second rectangular tab structure 24 that is most proximal to the first rectangular tab structure 23, and is located in a vertical plane that intersects boundaries between the second rectangular tab structure 24 and the second plurality of parallel metal lines 22 (which is represented by another dotted line in FIG. 1B).

For each pair of vertically adjacent line levels that include two pairs of line level structures (e.g., a first line level structure 15 and a second line level structure 16 as illustrated in FIG. 1A and a first line level structure 25 and a second line level structure 26 as illustrated in FIG. 1B) belonging to the metal capacitor structure, each pair of vertically adjacent first line level structures (15, 25) are contacted by at least one first intra-tab via structure 41. As illustrated in FIGS. 1A-1C, horizontal cross-sectional areas of the pair of vertically adjacent first line level structures (15, 25) overlap in a top-down view at a corner of each rectangle representing a horizontal cross-sectional area of the first rectangular tab structure 13 or the first rectangular tab structure 23. The at least one first intra-tab via structure 41 vertically contacts the corner regions of the first rectangular tab structure 13 or the first rectangular tab structure 23 that overlap each other in a (see-through) top-down view. Thus, all first line level structure (15, 25) in the metal capacitor structure are electrically shorted through conductive structures including the at least one first intra-tab via structure 41 to form a first electrode of the metal capacitor structure.

Likewise, for each pair of vertically adjacent line levels that include two pairs of line level structures belonging to the metal capacitor structure, each pair of vertically adjacent second line level structures (16, 26) are contacted by at least one second intra-tab via structure 42. As illustrated in FIGS. 1A-1C, horizontal cross-sectional areas of the pair of vertically adjacent second line level structures (16, 26) overlap in a top-down view at a corner of each rectangle representing a horizontal cross-sectional area of the second rectangular tab structure 14 or the second rectangular tab structure 24. The at least one second intra-tab via structure 42 vertically contacts the corner regions of the second rectangular tab structure 14 or the second rectangular tab structure 24 that overlap each other in a (see-through) top-down view. Thus, all second line level structure (16, 26) in the metal capacitor structure are electrically shorted through conductive structures including the at least one second intra-tab via structure 42 to form a first electrode of the metal capacitor structure.

The metal capacitor structure can further include a first plurality of intra-line via structures 31 and a second plurality of intra-line via structures 32. Each of the first plurality of intra-line via structures 31 vertically contacts an overlying first metal line (11 or 21) in one of the plurality of first line level structures (15, 25) and an underlying first metal line (21 or 11) in another of the plurality of first line level structures (15, 25). The first plurality of intra-line via structures 31 provides an additional electrically conductive path between first metal lines (11, 21) located within different line levels. Thus, the first plurality of intra-line via structures 31 reduces the internal resistance of the first electrode, which includes at least the first line level structures (15, 25), the at least one first intra-tab via structure 41, and optionally the first plurality of intra-line via structures 31. Further, the first plurality of intra-line via structures 31 increases the capacitance of the metal capacitor structure by providing additional capacitive coupling with the overlying second metal lines (12 or 22) and underlying second metal lines (22 or 12). The first plurality of intra-line via structures 31 can be provided at every via level between a pair of vertically adjacent line levels, or can be provided in some, but not all, of the via levels within the metal capacitor structure, or can be omitted.

Each of the second plurality of intra-line via structures 32 vertically contacts an overlying second metal line (12 or 22) in one of the plurality of second line level structures (16, 26) and an underlying second metal line (22 or 12) in another of the plurality of second line level structures (16, 26). The second plurality of intra-line via structures 32 provides an additional electrically conductive path between second metal lines (12, 22) located within different line levels. Thus, the second plurality of intra-line via structures 32 reduces the internal resistance of the second electrode, which includes at least the second line level structures (16, 26), the at least one second intra-tab via structure 42, and optionally the second plurality of intra-line via structures 32. Further, the second plurality of intra-line via structures 32 increases the capacitance of the metal capacitor structure by providing additional capacitive coupling with the overlying first metal lines (11 or 21) and underlying first metal lines (21 or 11). The second plurality of intra-line via structures 32 can be provided at every via level between a pair of vertically adjacent line levels, or can be provided in some, but not all, of the via levels within the metal capacitor structure, or can be omitted.

The metal capacitor structure can further include a first plurality of line-to-tab via structures 33 and a second plurality of line-to-tab via structures 34. For any pair of vertically adjacent line levels and the via level therebetween within the metal capacitor structure, each of the first plurality of line-to-tab via structures 33 vertically contacts another first metal line (11 or 21) in one of the plurality of first line level structures (15, 25) and a first rectangular tab structure (23 or 13) in another of the plurality of first line level structures (15, 25). The first plurality of line-to-tab via structures 33 provides an additional electrically conductive path between a first metal line (11 or 21) and a first rectangular tab structure (23 or 13) located within different line levels. Thus, the first plurality of line-to-tab via structures 33 reduces the internal resistance of the first electrode, which includes at least the first line level structures (15, 25), the at least one first intra-tab via structure 41, and optionally the first plurality of intra-line via structures 31 and/or the first plurality of line-to-tab via structures 33. Further, the first plurality of line-to-tab via structures 33 increases the capacitance of the metal capacitor structure by providing additional capacitive coupling with the overlying second metal lines (12 or 22) and underlying second metal lines (22 or 12). The first plurality of line-to-tab via structures 33 can be provided at every via level between a pair of vertically adjacent line levels, or can be provided in some, but not all, of the via levels within the metal capacitor structure, or can be omitted.

Likewise, for any pair of vertically adjacent line levels and the via level therebetween within the metal capacitor structure, each of the second plurality of line-to-tab via structures 34 vertically contacts another second metal line (12 or 22) in one of the plurality of second line level structures (16, 26) and a second rectangular tab structure (24 or 14) in another of the plurality of second line level structures (16, 26). The second plurality of line-to-tab via structures 34 provides an additional electrically conductive path between a second metal line (12 or 22) and a second rectangular tab structure (24 or 14) located within different line levels. Thus, the second plurality of line-to-tab via structures 34 reduces the internal resistance of the second electrode, which includes at least the second line level structures (16, 26), the at least one second intra-tab via structure 42, and optionally the second plurality of intra-line via structures 32 and/or the second plurality of line-to-tab via structures 34. Further, the second plurality of line-to-tab via structures 34 increases the capacitance of the metal capacitor structure by providing additional capacitive coupling with the overlying first metal lines (11 or 21) and underlying first metal lines (21 or 11). The second plurality of line-to-tab via structures 34 can be provided at every via level between a pair of vertically adjacent line levels, or can be provided in some, but not all, of the via levels within the metal capacitor structure, or can be omitted.

In each even-numbered line level, each first rectangular tab structure 13 in a first line level structure 15 can have a first tab width tw1 in the lengthwise direction of the metal lines in the interdigitated uniform pitch structure (11, 12) in the same line level. Further, each second rectangular tab structure 14 in the second line level structure 16 can have a tab width, which may be the same as, or different from, the first tab width tw1, in the lengthwise direction of the metal lines in the interdigitated uniform pitch structure (11, 12) in the same line level. The first tab width tw1 can be greater than 1½ times the pitch of an underlying or overlying interdigitated uniform pitch structure (21, 22) located in a vertically adjacent line level. In one embodiment, each of the plurality of first rectangular tab structures 13 and the plurality of second rectangular tab structures 14 in even-numbered line levels can have a first tab width tw1 that is at least 150% of the pitch of the interdigitated uniform pitch structure (11, 12) in that line level In an equal line-space structure, for example, 1½ times the pitch corresponds to a total width of two lines and a space. Thus, at least one of the first plurality of parallel metal lines 21 and at least one of the second plurality of parallel metal lines 22 in the vertically adjacent line level can underlie or overlie the first rectangular tab structure 13. As discussed above, one or more of the first plurality of parallel metal lines 21 underlying or overlying the first rectangular tab structure 13 may be connected to the first rectangular tab structure 13 by a first plurality of line-to-tab via structures 33. Any of the second plurality of parallel metal lines 22 that underlie or overlie the first rectangular tab structure 13 is electrically isolated from the first rectangular tab structure 13. Further, at least another of the first plurality of parallel metal lines 21 and at least another of the second plurality of parallel metal lines 22 in the vertically adjacent line level can underlie or overlie the second rectangular tab structure 14. As discussed above, one or more of the second plurality of parallel metal lines 22 underlying or overlying the second rectangular tab structure 14 may be connected to the second rectangular tab structure 14 by a second plurality of line-to-tab via structures 34. Any of the first plurality of parallel metal lines 21 that underlie or overlie the second rectangular tab structure 14 is electrically isolated from the second rectangular tab structure 14.

In each odd-numbered line level, each first rectangular tab structure 23 in a first line level structure 25 can have a second tab width tw2 in the lengthwise direction of the metal lines in the interdigitated uniform pitch structure (21, 22) in the same line level. Further, each second rectangular tab structure 24 in the second line level structure 26 can have a tab width, which may be the same as, or different from, the second tab width tw2, in the lengthwise direction of the metal lines in the interdigitated uniform pitch structure (21, 22) in the same line level. The second tab width tw2 can be greater than 1½ times the pitch of an underlying or overlying interdigitated uniform pitch structure (11, 12) located in a vertically adjacent line level. In one embodiment, each of the plurality of first rectangular tab structures 23 and the plurality of second rectangular tab structures 24 in odd-numbered line levels can have a second tab width tw2 that is at least 150% of the pitch of the interdigitated uniform pitch structure (21, 22) in that line level.

Because 1½ times the pitch corresponds to a total width of two lines and a space in an equal line-space structure, at least one of the first plurality of parallel metal lines 11 and at least one of the second plurality of parallel metal lines 12 in the vertically adjacent line level can underlie or overlie the first rectangular tab structure 23. As discussed above, one or more of the first plurality of parallel metal lines 11 underlying or overlying the first rectangular tab structure 23 may be connected to the first rectangular tab structure 23 by a first plurality of line-to-tab via structures 33. Any of the second plurality of parallel metal lines 12 that underlie or overlie the first rectangular tab structure 23 is electrically isolated from the first rectangular tab structure 23. Further, at least another of the first plurality of parallel metal lines 11 and at least another of the second plurality of parallel metal lines 12 in the vertically adjacent line level can underlie or overlie the second rectangular tab structure 24. As discussed above, one or more of the second plurality of parallel metal lines 12 underlying or overlying the second rectangular tab structure 24 may be connected to the second rectangular tab structure 24 by a second plurality of line-to-tab via structures 34. Any of the first plurality of parallel metal lines 11 that underlie or overlie the second rectangular tab structure 24 is electrically isolated from the second rectangular tab structure 24.

Within each even-numbered line level, the first plurality of parallel metal lines 11 and the second plurality of parallel metal lines 12 can have a same width throughout within the interdigitated uniform pitch structure (11, 12), i.e., the first width w1. Each of the first plurality of parallel metal lines 11 has a sidewall that is parallel to, and having a first spacing s1 from, a sidewall of one of the second plurality of parallel metal lines 12. In one embodiment, the first spacing s1 can be a "uniform" spacing that is invariant under translation in the lengthwise direction of the metal lines in the interdigitated uniform pitch structure (11, 12), i.e., in the horizontal direction perpendicular to the D-D' plane.

Further, in a portion of the interdigitated uniform pitch structure (11, 12) in which the first plurality of parallel metal lines 11 and the second plurality of parallel metal lines 12 are alternately present, the interdigitated uniform pitch structure (11, 12) can have a same pitch throughout. The portion of the interdigitated uniform pitch structure (11, 12), in which the first plurality of parallel metal lines 11 and the second plurality of parallel metal lines 12 are alternately present, constitute a one-dimensional array having a uniform pitch, which is invariant under translation in the lengthwise direction of the metal lines in the interdigitated uniform pitch structure (11, 12). This uniform pitch is the sum of the first width w1 and the first spacing s1. In other words, the sum of the common width for the first plurality of parallel metal lines 11 and the second plurality of parallel metal lines 12 and the uniform spacing between adjacent metal lines in the interdigitated uniform pitch structure (11, 12) can be equal to the pitch of the interdigitated uniform pitch structure (11, 12).

Within each odd-numbered line level, the first plurality of parallel metal lines 21 and the second plurality of parallel metal lines 22 can have a same width throughout within the interdigitated uniform pitch structure (21, 22), i.e., the second width w2. Each of the first plurality of parallel metal lines 21 has a sidewall that is parallel to, and having a second spacing s2 from, a sidewall of one of the second plurality of parallel metal lines 22. The second spacing s2 is a "uniform" spacing that is invariant under translation in the lengthwise direction of the metal lines in the interdigitated uniform pitch structure (21, 22), i.e., in the horizontal direction within the D-D' plane.

Further, in a portion of the interdigitated uniform pitch structure (21, 22) in which the first plurality of parallel metal lines 21 and the second plurality of parallel metal lines 22 are alternately present, the interdigitated uniform pitch structure (21, 22) can have a same pitch throughout. The portion of the interdigitated uniform pitch structure (21, 22), in which the first plurality of parallel metal lines 21 and the second plurality of parallel metal lines 22 are alternately present, constitute another one-dimensional array having a uniform pitch, which is invariant under translation in the lengthwise direction of the metal lines in the interdigitated uniform pitch structure (21, 22). This uniform pitch is the sum of the second width w2 and the second spacing s2. In other words, the sum of the common width for the first plurality of parallel metal lines 21 and the second plurality of parallel metal lines 22 and the uniform spacing between adjacent metal lines in the interdigitated uniform pitch structure (21, 22) can be equal to the pitch of the interdigitated uniform pitch structure (21, 22).

The plurality of line level structures (15, 16, 25, 26) and the at least one via level structure (31, 32, 33, 34, 41, 42) are a complementary set of structures constituting a first electrode (15, 25, 31, 33, 41) and a second electrode (16, 26, 32, 34, 42). The first electrode (15, 25, 31, 33, 41) is not in direct contact with the second electrode (16, 26, 32, 34, 42). The first electrode (15, 25, 31, 33, 41) includes the plurality of first line level structures (15, 25) and first via structures (31, 33, 41), and the second electrode (16, 26, 32, 34, 42) includes the plurality of second line level structures (16, 26) and second via structures (32, 34, 42). The first via structures (31, 33, 41) include at least one first intra-tab via structure 41 and optionally a first plurality of intra-line via structures 31 and/or optionally a first plurality of line-to-tab via structures 33. The second via structures (32, 34, 42) include at least one second intra-tab via structure 42 and optionally a second plurality of intra-line via structures 32 and/or optionally a second plurality of line-to-tab via structures 34.

Each of the at least one first intra-tab via structure 41 contacts a vertically adjacent pair among the plurality of first rectangular tab structures (13, 23), i.e., a first rectangular tab structure 13 located within an even-numbered line level and a first rectangular tab structure 23 located within an odd-numbered line level. Likewise, each of the at least one second intra-tab via structure 42 contacts a vertically adjacent pair among the plurality of second rectangular tab structures (14, 24), i.e., a second rectangular tab structure 14 located within an even-numbered line level and a second rectangular tab structure 24 located within an odd-numbered line level.

Horizontal cross-sectional areas of the vertically adjacent pair among the plurality of first rectangular tab structures (13, 23) have a rectangular intersection area, which is the area of the corner region of the corresponding first rectangular tab structure 13 in the even-numbered line level, and also is the area of the corner region of the corresponding first rectangular tab structure 23 in the odd-numbered line level. A side of the rectangular intersection area, i.e., the cross-sectional area of each corner region in the vertically adjacent first rectangular tab structures (13, 23), coincides with a sidewall of one of the vertically adjacent pair among the plurality of first rectangular tab structures (13 or 23), and another side of the rectangular intersection area coincides with a sidewall of the other of the vertically adjacent pair among the plurality of first rectangular tab structures (23 or 13).

Likewise, horizontal cross-sectional areas of the vertically adjacent pair among the plurality of second rectangular tab structures (14, 24) have a rectangular intersection area, which is the area of the corner region of the corresponding second rectangular tab structure 14 in the even-numbered line level, and also is the area of the corner region of the corresponding second rectangular tab structure 24 in the odd-numbered line level. A side of the rectangular intersection area, i.e., the cross-sectional area of each corner region in the vertically adjacent second rectangular tab structures (14, 24), coincides with a sidewall of one of the vertically adjacent pair among the plurality of second rectangular tab structures (14 or 24), and another side of the rectangular intersection area coincides with a sidewall of the other of the vertically adjacent pair among the plurality of second rectangular tab structures (24 or 14).

Each of the first plurality of line-to-tab via structures 33 vertically contacts a first metal line (11 or 21) in one of the plurality of first line level structures (15 or 25) and a first rectangular tab structure (23 or 13) in another of the plurality of first line level structures (25 or 15). The two first line level structures (15, 25) that each of the first plurality of line-to-tab via structures 33 contacts are located within vertically adjacent line levels. Each of the second plurality of line-to-tab via structures 34 vertically contacts a second metal line (12 or 22) in one of the plurality of second line level structures (16 or 26) and a second rectangular tab structure (24 or 14) in another of the plurality of second line level structures (26 or 16). The two second line level structures (16, 26) that each of the second plurality of line-to-tab via structures 34 contacts are located within vertically adjacent line levels.

Each of the first plurality of intra-line via structures 31 vertically contacts another first metal line (11 or 21) in one of the plurality of first line level structures (15 or 25) and yet another metal line (21 or 11) in the other of said plurality of first line level structures (25 or 15). The two first line level structures (15, 25) that each of the first plurality of intra-line via structures 31 contacts are located within vertically adjacent line levels. Each of the second plurality of intra-line via structures 32 vertically contacts another second metal line (12 or 22) in one of the plurality of second line level structures (16 or 26) and yet another metal line (22 or 12) in the other of the plurality of second line level structures (26 or 16). The two second line level structures (16, 26) that each of the second plurality of intra-line via structures 32 contacts are located within vertically adjacent line levels.

The first electrode (15, 25, 31, 33, 41) and a second electrode (16, 26, 32, 34, 42) are embedded in at least one dielectric material layer 90, which includes at least one of silicon oxide, silicon nitride, organosilicate glass, any other dielectric material that can be employed to embed a metal interconnect structure therein, and a combination thereof. Each of the first electrode (15, 25, 31, 33, 41) and the second electrode (16, 26, 32, 34, 42) includes at least one metallic material, which can be, but is not limited to, Cu, Ag, Au, Al, W, Ti, Ta, WN, TiN, TaN, and a combination thereof. Metallic liner materials as known in the art can also be added to the structure of the first electrode (15, 25, 31, 33, 41) and the second electrode (16, 26, 32, 34, 42). Typically, the material of the first electrode (15, 25, 31, 33, 41) and the second electrode (16, 26, 32, 34, 42) is the same within each level, i.e., within a given line level or within a given via level. The material of the first electrode (15, 25, 31, 33, 41) and the second electrode (16, 26, 32, 34, 42) can be, but does not need to be, different among different levels.

Each of the plurality of first line level structures (15, 25) is of integral construction, and each of the plurality of second line level structures (16, 26) is of integral construction. Each pair of a first line level structure (15 or 25) and a second line level structure (16 or 26) located within a same line level has a same thickness throughout because the pair of line level structures are simultaneously formed by formation of line trenches in a dielectric material layer, filling the trenches with a conductive material, and planarization of the conductive material to remove excess portions above the dielectric material layer.

In one embodiment, a dual damascene method can be employed to form a pair of line level structures and via level structures directly underneath the pair of line level structures. Thus, one of the plurality of first line level structures (15 or 25) can be of integral construction with a first set of underlying via level structures (31, 33, 41), and one of the plurality of second line level structures (16 or 26) in the same line level as the plurality of first line level structures (15 or 25) can be of integral construction with a second set of underlying via level structures (32, 34, 42).

In another embodiment, single damascene methods can be employed to first form via level structures, and then to form a pair of line level structures in the line level directly above the via level. In this embodiment, the via level structures are not of integral construction with an overlying line level structure (15, 16, 25, or 26). Thus, microscopic interfaces are present between one of the plurality of first line level structures (15 or 25) and a first set of underlying via level structures (31, 33, 41) located directly underneath, and between one of the plurality of second line level structures (16, 26) in the same line level as the first line level structure (15 or 25) and a second set of underlying via level structures (32, 34, 42) located directly underneath.

In one embodiment, the pitch of an interdigitated uniform pitch structure ((11, 12) or (21, 22)) can be the same for a plurality of interdigitated uniform pitch structures (11, 12, 21, 22) located in different line levels within the metal capacitor structure. In one case, all interdigitated uniform pitch structures (11, 12, 21, 22) can have the same pitch.

The direction of the pitch alternates between a pair of two horizontal directions that are perpendicular to each other in each successive line level from bottom to top within the metal capacitor structure.

Referring to FIGS. 2A-2F, various views are illustrated of a second exemplary structure that includes a metal capacitor structure according to a second embodiment of the present disclosure. The second exemplary structure of FIGS. 2A-2F can be derived from the first exemplary structure of FIGS. 1A-1G by omitting the first plurality of line-to-tab via structures 33 and the second plurality of line-to-tab via structures 34. Only the at least one first intra-tab via structure 41 vertically contacts the first rectangular tab structures (13, 23) within the metal capacitor structure, and only the at least one second intra-tab via structure 42 vertically contacts the second rectangular tab structures (14, 24) within the metal capacitor structure.

Figure 3:
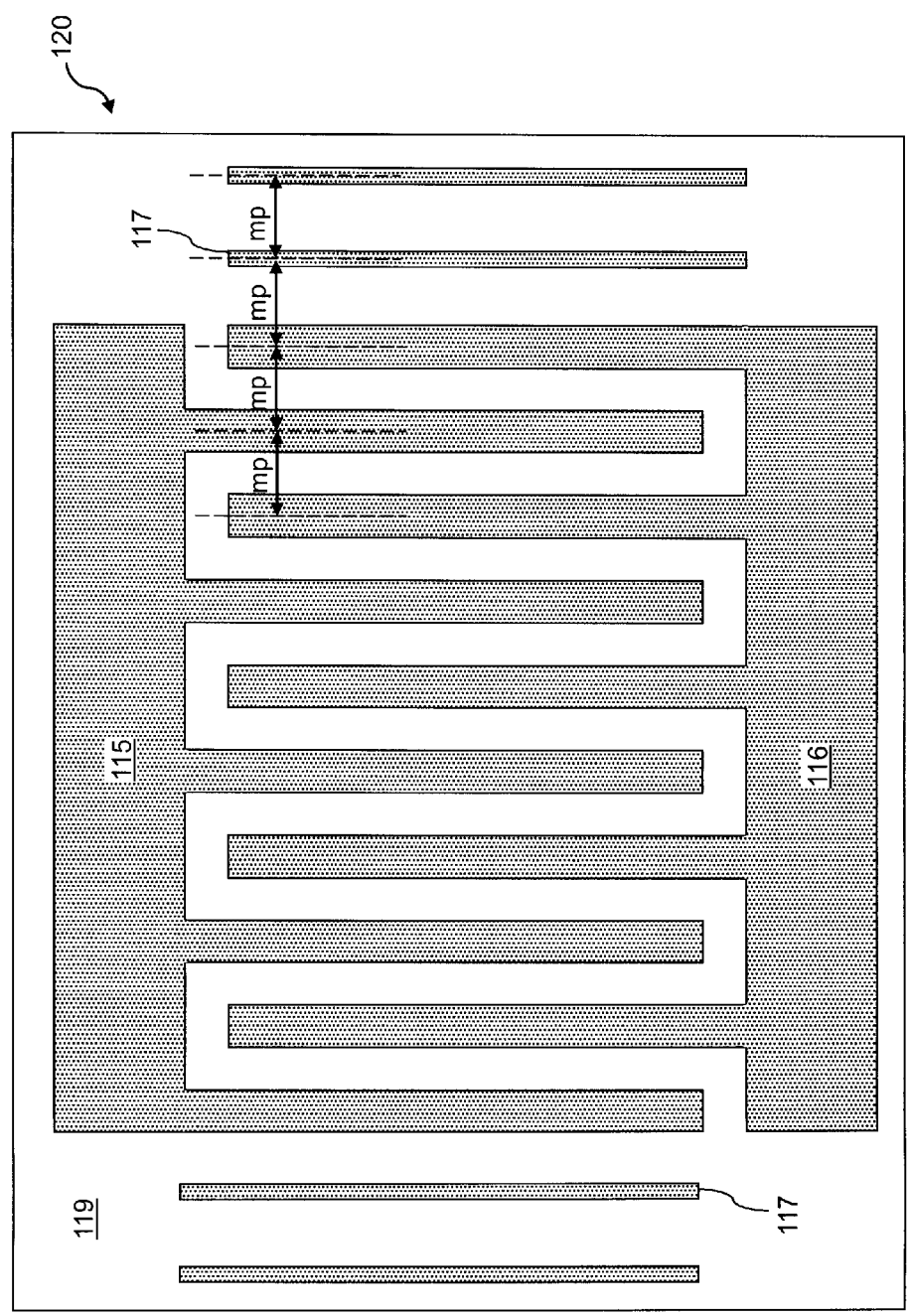
FIG. 3 is an exemplary reticle that can be employed to pattern a line level structure of a metal capacitor structure according to an embodiment of the present disclosure.

Referring to FIG. 3, an exemplary reticle 120 is illustrated that can be employed to pattern a line level structure of a metal capacitor structure according to an embodiment of the present disclosure. The exemplary reticle 120 includes a transparent substrate 119 and patterned optically opaque layers thereupon. Depending on the polarity of the exemplary reticle 120, the patterned optically opaque layers may include shapes that are geometrically proportional to horizontal cross-sectional shapes of a first line level structure (15 or 25) and a second line level structure (16 or 26), or may have the complementary shape thereof. For example, the patterned optically opaque layer can include a first optically opaque line level pattern 115 and a second optically opaque line level pattern 116. The first optically opaque line level pattern 115 is geometrically proportional to the horizontal cross-sectional shapes of a first line level structure (15 or 25). The second optically opaque line level pattern 116 is geometrically proportional to the horizontal cross-sectional shapes of a second line level structure (16 or 26).

In an embodiment in which the interdigitated uniform pitch structure ((11, 12) or (21, 22)) can include lines of uniform width separated by a uniform spacing, the set of the first optically opaque line level pattern 115 and the second optically opaque line level pattern 116 can include a portion in which a periodic one-dimensional line array is present with a reticle pitch between adjacent opaque line-shaped regions. This reticle pitch can be a minimum reticle pitch mp that can be lithographically printed on a photoresist in a single exposure, thereby enabling printing of minimum pitch pattern on a photoresist during lithographic exposure, and subsequent transfer of the minimum pitch pattern in an underlying dielectric material layer. Thus, the interdigitated uniform pitch structure ((11, 12) or (21, 22)) can include a one-dimensional array of a critical pitch, i.e., the minimum pitch that can lithographically printed in a single lithographic exposure.

Further, optical proximity correction may be applied to the shapes of the first optically opaque line level pattern 115 and the second optically opaque line level pattern 116. In addition, sub-resolution assist features (SRAFs) 117 can be added to the exemplary reticle 120 to provide uniform line widths and uniform spacing in the interdigitated uniform pitch structure ((11, 12) or (21, 22)), i.e., line widths and spacings that are invariant under translation along the lengthwise direction of metal lines in the interdigitated uniform pitch structure ((11, 12) or (21, 22)). All line widths can be the same within each interdigitated uniform pitch structure ((11, 12) or (21, 22)) and/or all spacings can be the same within each interdigitated uniform pitch structure ((11, 12) or (21, 22)).

Because the first rectangular tap structure (13 or 23) and the second rectangular tab structure (14 or 24) do not protrude into a region between the two proximate sidewalls of the first rectangular tap structure (13 or 23) and the second rectangular tab structure (14 or 24) that face each other, placement of the SRAFs 117 is not restricted in any way within the exemplary reticle 120. This allows printing of all metal lines in the interdigitated uniform pitch structure ((11, 12) or (21, 22)) with the same width by placement of the SRAFs 117 in proximity to the edges of the peripheral line shapes of the first optically opaque line level pattern 115 and the second optically opaque line level pattern 116, i.e., the line shapes representing the outer metal lines of the interdigitated uniform pitch structure ((11, 12) or (21, 22)). Thus, the outermost parallel metal lines (11, 12, 21, 22) within the first and second line level structures ((15, 16) or (25, 26)) can have a uniform width throughout, such as the first width w1 in FIGS. 1A and 2A or the second width w2 in FIGS. 1B and 2B.

Figure 4:
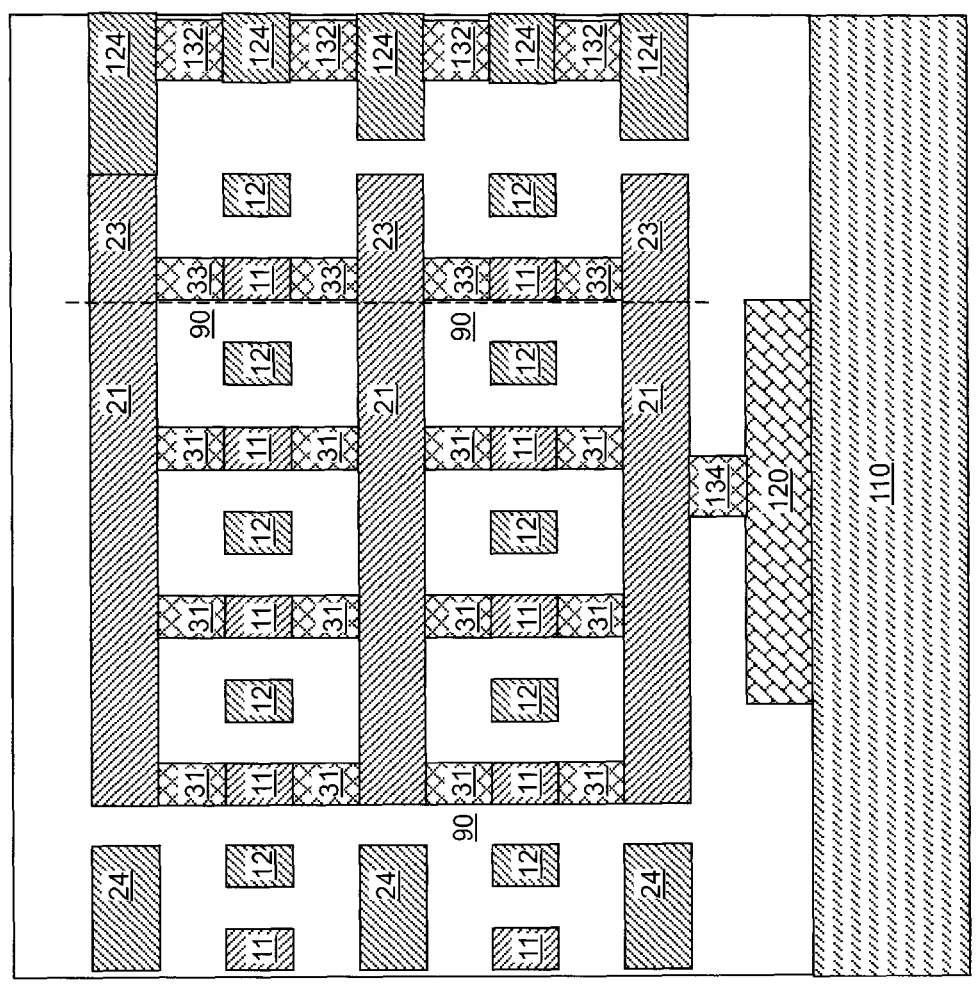
FIG. 4 is a vertical cross-sectional view of a third exemplary structure according to an embodiment of the present disclosure.

Referring to FIG. 4, a vertical cross-sectional view of a third exemplary structure according to an embodiment of the present disclosure is illustrated. The metal capacitor structure can be embedded in at least one dielectric material layer 90 located on a semiconductor substrate 110. Further, the metal semiconductor structure can be conductively connected to at least one semiconductor device 120 located on the semiconductor substrate 110, for example, by at least one metal interconnect structure 134. Further, additional line level metal interconnect structures 124 and additional via level metal interconnect structures 132 can be formed within the at least one dielectric material layer 90 as embedded structures. The first electrode (15, 25, 31, 33, 41) and the second electrode (16, 26, 32, 34, 42) can be conductively connected to one or more of the at least one semiconductor device 120, or one of the first electrode (15, 25, 31, 33, 41) and the second electrode (16, 26, 32, 34, 42) can be connected to a power supply node or other structures via the additional line level metal interconnect structures 124 and additional via level metal interconnect structures 132.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A metal capacitor structure comprising a plurality of line level structures and at least one via level structure, wherein said plurality of line level structures extends across a plurality of line levels that are numerically labeled with consecutive integers along a vertical direction from a substrate and wherein, at each line level, said plurality of line level structures comprises:
   a first line level structure comprising a first rectangular tab structure having a shape of a first rectangular parallelepiped and a first plurality of parallel metal lines protruding from, and adjoined to, a sidewall of said first rectangular tab structure; and
   a second line level structure comprising a second rectangular tab structure having a shape of a second rectangular parallelepiped and a second plurality of parallel metal lines protruding from, and adjoined to, a sidewall of said second rectangular tab structure, said sidewall of said second rectangular tab structure being parallel to said sidewall of said first rectangular tab structure, wherein said first plurality of parallel metal lines and said second plurality of parallel metal lines collectively constitute an interdigitated uniform pitch structure having a pitch in a direction that is perpendicular to a lengthwise direction of said first and second pluralities of parallel metal lines, and said first rectangular tab structure and said second rectangular tab structure do not protrude into a region between said sidewall of said first rectangular tab structure and said sidewall of said second rectangular tab structure, and each of said first rectangular tab structure and said second rectangular tab structure has a tab width, as measured between a pair of sidewalls of a corresponding rectangular tab structure along said lengthwise direction of said first and second pluralities of parallel metal lines, that is greater than 1 ½ times said pitch,
   wherein, across said plurality of line levels, a lengthwise direction of metal lines within an interdigitated uniform pitch structure in an even-numbered line level is perpendicular to a lengthwise direction of metal lines within another interdigitated uniform pitch structure in an odd-numbered line level,
   wherein said at least one via level structure comprises a first plurality of intra-line via structures and a second plurality of intra-line via structures that are located between an (x+1)-th line level and an x-th line level, wherein x is a positive integer,
   wherein parallel metal lines within said (x+1)-th line level and parallel metal lines within said x-th level extend in directions perpendicular to each other such that horizontal cross-sectional areas of said parallel metal lines within said (x+1)-th line level and said parallel metal lines within said x-th line level overlap and define a plurality of areal overlap regions,
   wherein each of said first plurality of intra-line via structures and said second plurality of intra-line via structures is located within one of said plurality of overlap regions, said first plurality of intra-line via structures provide vertically conductive paths between said first line level structures in said (x+1)-th line level and said x-th line level, said second plurality of intra-line via structures provide vertically additional conductive paths between said second line level structures in said (x+1)-th line level and said x-th line level, and said first plurality of intra-line via structures is electrically isolated from said second plurality of intra-line via structures,
   wherein each pair of vertically adjacent first rectangular tab structures is contacted by a plurality of first intra-tab via structures at a first rectangular corner region that is defined as an entire region at which horizontal cross-sectional areas of said pair of vertically adjacent first rectangular tab structures overlap in a top-down view, and each pair of vertically adjacent second rectangular tab structures is contacted by a plurality of second intra-tab via structure at a second rectangular corner region defined as an entire region at which horizontal cross-sectional areas of said pair of vertically adjacent second rectangular tab structures overlap in said top-down view.

2. The metal capacitor structure of claim 1, wherein each of said first plurality of intra-line via structures vertically contacts an overlying first metal line in one of said plurality of first line level structures and an underlying first metal line in another of said plurality of first line level structures, and each of said second plurality of intra-line via structures vertically contacts an overlying second metal line in one of said plurality of second line level structures and an underlying second metal line in another of said plurality of second line level structures.

3. The metal capacitor structure of claim 1, further comprising a first plurality of line-to-tab via structures and a second plurality of line-to-tab via structures, wherein each of said first plurality of line-to-tab via structures vertically contacts another first metal line in said one of said plurality of first line level structures and a first rectangular tab structure in said other of said plurality of first line level structures, and each of said second plurality of intra-line via structures vertically contacts another second metal line in said one of said plurality of second line level structures and a second rectangular tab structures in said other of said plurality of second line level structures.

4. The metal capacitor structure of claim 1, wherein said first plurality of parallel metal lines and said second plurality of parallel metal lines have a same width throughout within said interdigitated uniform pitch structure.

5. The metal capacitor structure of claim 4, wherein each of said first plurality of parallel metal lines has a sidewall that is parallel to, and having a uniform spacing from, a sidewall of one of said second plurality of parallel metal lines.

6. The metal capacitor structure of claim 5, wherein a sum of said same width and said uniform spacing equals said pitch of said interdigitated uniform pitch structure.

7. The metal capacitor structure of claim 1, wherein said sidewall of said first rectangular tab structure and said sidewall of said second rectangular tab structure are laterally spaced from each other by a separation distance therebetween that is invariant under translation along a horizontal direction of said sidewall of said first rectangular tab structure.

8. The metal capacitor structure of claim 1, wherein said plurality of line level structures and said at least one via level structure are a complementary set of structures constituting a first electrode and a second electrode, said first electrode not in direct contact with said second electrode, said first electrode comprising said plurality of first line level structures and first via structures, and said second electrode comprising said plurality of second line level structures and second via structures.

9. The metal capacitor structure of claim 8, wherein said at least one via level structure comprises:
- at least one first intra-tab via structure contacting a vertically adjacent pair among said plurality of first rectangular tab structures; and
- at least one second intra-tab via structure contacting a vertically adjacent pair among said plurality of second rectangular tab structures.

10. The metal capacitor structure of claim 9, wherein horizontal cross-sectional areas of said vertically adjacent pair among said plurality of first rectangular tab structures have a rectangular intersection area, wherein a side of said rectangular intersection area coincides with a sidewall of one of said vertically adjacent pair among said plurality of first rectangular tab structures and another side of said rectangular intersection area coincides with a sidewall of the other of said vertically adjacent pair among said plurality of first rectangular tab structures.

11. The metal capacitor structure of claim 10, wherein horizontal cross-sectional areas of said vertically adjacent pair among said plurality of second rectangular tab structures have another rectangular intersection area, wherein a side of said other rectangular intersection area coincides with a sidewall of one of said vertically adjacent pair among said plurality of second rectangular tab structures and another side of said other rectangular intersection area coincides with a sidewall of the other of said vertically adjacent pair among said plurality of second rectangular tab structures.

12. The metal capacitor structure of claim 9, wherein said at least one via level structure further comprises:
- a first plurality of line-to-tab via structures vertically contacting a first metal line in one of said plurality of first line level structures and a first rectangular tab structure in another of said plurality of first line level structures; and
- a second plurality of line-to-tab via structures vertically contacting a second metal line in one of said plurality of second line level structures and a second rectangular tab structure in another of said plurality of second line level structures.

13. The metal capacitor structure of claim 8, wherein said first electrode and said second electrode are embedded in at least one dielectric material layer comprising at least one of silicon oxide, silicon nitride, and organosilicate glass.

14. The metal capacitor structure of claim 8, wherein said first electrode and said second electrode comprise at least one material selected from Cu, Ag, Au, Al, W, Ti, Ta, WN, TiN, and TaN.

15. The metal capacitor structure of claim 1, wherein each of said plurality of first line level structures is of integral construction and each of said plurality of second line level structures is of integral construction, and each pair of a first line level structure and a second line level structure located within a same line level has a same thickness throughout.

16. The metal capacitor structure of claim 15, wherein one of said plurality of first line level structures is of integral construction with a first set of underlying via level structures, and one of said plurality of second line level structures in a same line level as said one of said plurality of first line level structures is of integral construction with a second set of underlying via level structures.

17. The metal capacitor structure of claim 15, wherein microscopic interfaces are present between one of said plurality of first line level structures and a first set of underlying via level structures, and between one of said plurality of second line level structures in a same line level as said one of said plurality of first line level structures and a second set of underlying via level structures.

18. The metal capacitor structure of claim 1, wherein said pitch is the same for a plurality of interdigitated uniform pitch structures located in different line levels within said metal capacitor structure.

19. The metal capacitor structure of claim 18, wherein said direction of said pitch alternates between a pair of two horizontal directions that are perpendicular to each other in each successive line level from bottom to top within said metal capacitor structure.

20. The metal capacitor structure of claim 1, wherein outermost parallel metal lines within one of said plurality of line level structures have a uniform width throughout.

21. The metal capacitor structure of claim 1, wherein said metal capacitor structure is embedded in at least one dielectric material layer located on said substrate.

22. The metal capacitor structure of claim 21, wherein said metal semiconductor structure is conductively connected to a semiconductor device located on said semiconductor substrate.

23. The metal capacitor structure of claim 1, wherein no additional conductive structure is present between each pair of vertically adjacent first line level structures other than said plurality of first intra-tab via structures, and no additional conductive structure is present between each pair of vertically adjacent second line level structures other than said plurality of second intra-tab via structures.

24. The metal capacitor structure of claim 1, wherein said plurality of first intra-tab via structures comprise an array of first intra-tab via structures that are repeated along two different directions, and said plurality of second intra-tab via structures comprise an array of second intra-tab via structures that are repeated along said two different directions.

* * * * *